US012796341B2

(12) United States Patent
Yang et al.

(10) Patent No.: US 12,796,341 B2

(45) Date of Patent: Nov. 10, 2026

(54) SEMICONDUCTOR DEVICE AND METHODS OF FORMATION

(71) Applicant: Taiwan Semiconductor Manufacturing Company, Ltd., Hsinchu (TW)

(72) Inventors: Tsung-Hsueh Yang, Taichung City (TW); Yu-Wen Wang, Taichung City (TW); Chang-Chih Huang, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 352 days.

(21) Appl. No.: 18/422,747

(22) Filed: Jan. 25, 2024

(65) Prior Publication Data

US 2025/0248319 A1 Jul. 31, 2025

(51) Int. Cl.

*H10N 70/20* (2023.01)
*H10B 63/00* (2023.01)
*H10N 70/00* (2023.01)

(52) U.S. Cl.

CPC ........... *H10N 70/231* (2023.02); *H10B 63/30* (2023.02); *H10N 70/063* (2023.02); *H10N 70/066* (2023.02); *H10N 70/068* (2023.02); *H10N 70/841* (2023.02); *H10N 70/8613* (2023.02)

(58) Field of Classification Search

CPC ............ H10B 63/30; H10B 63/00–845; H10N 70/063; H10N 70/066; H10N 70/068; H10N 70/841; H10N 70/231–235; H10D 84/0147

See application file for complete search history.

(56) References Cited

U.S. PATENT DOCUMENTS

2014/0264244 A1* 9/2014 Hong .................. H10N 70/801 257/4
2022/0359814 A1* 11/2022 Standaert ............... H10N 50/10
2023/0389449 A1* 11/2023 Yang .................... H10N 70/063
2025/0063958 A1* 2/2025 Jonnalagadda ...... H10N 70/231

* cited by examiner

*Primary Examiner* — Shahed Ahmed

(74) *Attorney, Agent, or Firm* — Harrity & Harrity, LLP

(57) ABSTRACT

A semiconductor device includes a radio frequency (RF) switch that includes a phase change material (PCM) layer. Sidewall spacers are formed on the sidewalls of the PCM layer to protect the PCM layer from oxidation. The sidewall spacers may be formed by depositing a dielectric layer over the RF switch and over a logic area of the semiconductor device, and performing a directional etch to remove the dielectric layer from the logic area such that the portions of the dielectric layer remain only on the sidewalls of the RF switch as the sidewall spacers. In this way, the sidewall spacers are formed in a manner that enables the PCM layer to be protected from oxidation without increasing the thickness of the semiconductor device in the logic region.

20 Claims, 35 Drawing Sheets

SEMICONDUCTOR DEVICE AND METHODS OF FORMATION

BACKGROUND

A radio frequency (RF) switch may be implemented using complementary metal oxide semiconductor (CMOS) manufacturing processes. An example of an RF switch includes a phase change material (PCM) RF switch. A PCM RF switch is an RF switch that selectively transitions (or switches) between an "on" state and an "off" state by selectively changing a phase of a PCM layer (e.g., a layer of PCM) of the PCM RF switch between a crystalline phase and an amorphous phase. In the on state, an RF signal is permitted to flow through the switching material of the RF switch between an input and an output. In the off state, the RF signal is restricted from flowing through the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
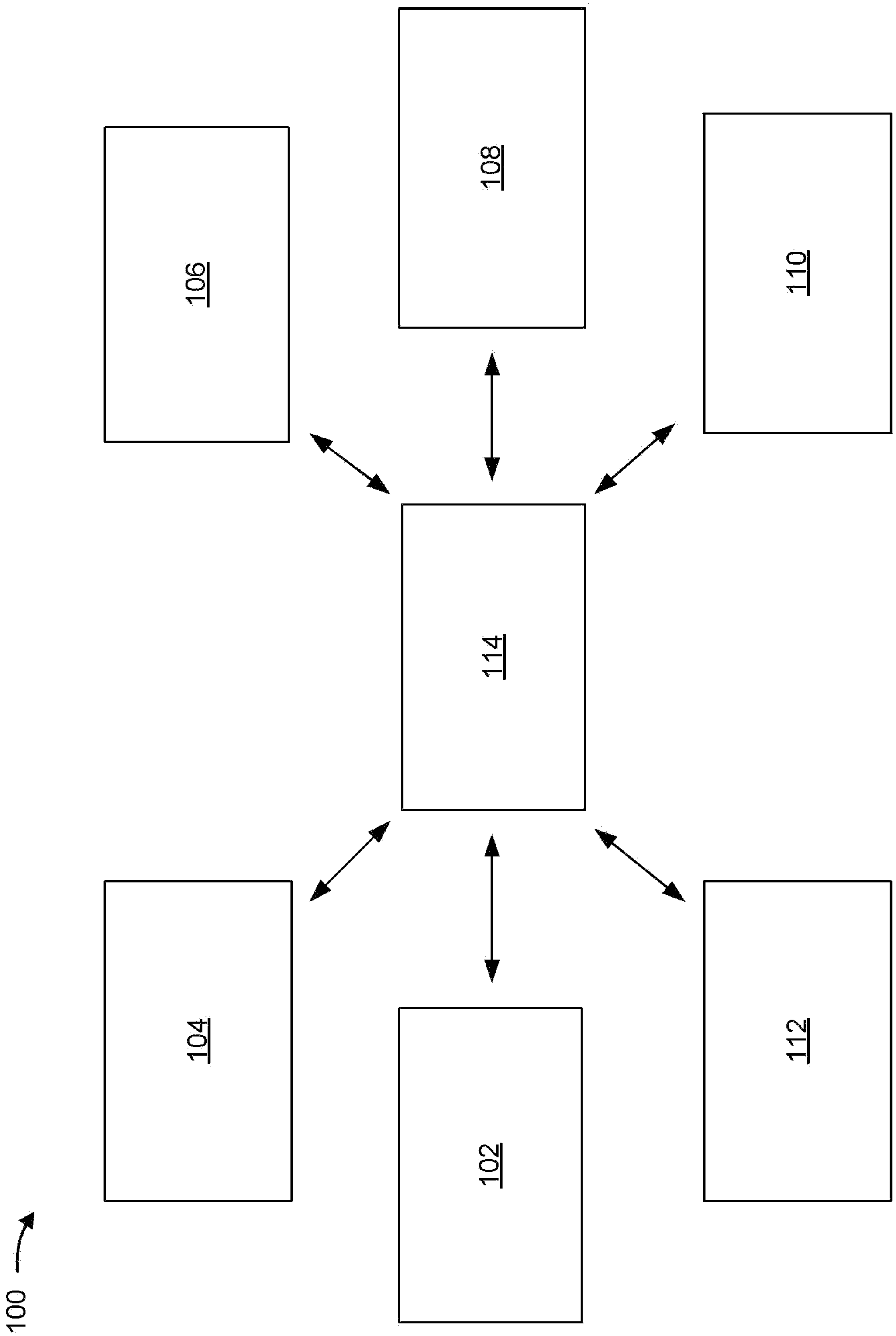
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Phase change materials (PCMs) that are typically used for a PCM layer of a PCM radio frequency (RF) switch are susceptible to oxidation if exposed to oxygen in the atmosphere and/or in other layers near the PCM layer. An additional layer of material may be deposited over the PCM layer to form a capping layer that protects the sidewalls of the PCM layer from oxidation. However, the capping layer may negatively affect other semiconductor processes of the semiconductor device in which the PCM RF switch is formed. The capping layer may be deposited across the semiconductor device, which may increase the thickness of the semiconductor device in other areas, such as in a logic region of the semiconductor device. This may result in under etching in other areas of the semiconductor device. For example, under etching may occur when etching backend dielectric layers of the semiconductor device for forming interconnects to metallization layers in the logic region of the semiconductor device. The under etching may result in a failure to connect the interconnects to the metallization layers, resulting in decreased performance and/or an increased likelihood of failure of the semiconductor device.

In some implementations described herein, a semiconductor device includes an RF switch that includes a PCM layer. Sidewall spacers are formed on the sidewalls of the PCM layer to protect the PCM layer from oxidation. The sidewall spacers are formed in a manner that does not increase the thickness of the semiconductor device in other areas of the semiconductor device, such as a logic area of the semiconductor device. For example, the sidewall spacers may be formed by depositing a dielectric layer over the RF switch and over the logic area, and performing a directional etch to remove the dielectric layer from the logic area such that the portions of the dielectric layer remain only on the sidewalls of the RF switch as the sidewall spacers. In this way, the sidewall spacers are formed in a manner that enables the PCM layer to be protected from oxidation without increasing the thickness of the semiconductor device in the logic region. This reduces the likelihood of under etching of recesses for interconnects in the logic region, which reduces the likelihood of failure to connect the interconnects with underlying metallization layers in the logic region. Accordingly, the sidewall spacers may enable increased performance of the semiconductor device to be achieved in that a greater yield of logic devices in the logic region may be achieved than without removal of the portions of the dielectric layer. Additionally and/or alternatively, the sidewall spacers may reduce the likelihood of failure of the semiconductor device. Moreover, the directional etch that is performed to form the sidewall spacers is performed without the use of additional masking layers, which reduces the semiconductor processing complexity, time, and cost of manufacturing the RF switch.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may be used to perform one or more semiconductor processing operations described herein. For example, one or more of the semiconductor processing tools 102-112 and/or the wafer/die transport tool 114 may be used to form a backend region, of a semiconductor device, above a semiconductor substrate of the semiconductor device; form, in an RF portion of the backend region, a layer stack of an RF switch; form a dielectric layer over the layer stack and over a logic portion of the backend region; and/or perform a self-aligned etch operation to remove first portions of the dielectric layer from the logic portion and from a top of the layer stack, where second portions of the dielectric layer, that remain on sidewalls of the layer stack, correspond to sidewall spacers of the RF switch, among other examples.

As another example, one or more of the semiconductor processing tools 102-112 and/or the wafer/die transport tool 114 may be used to form a backend region, of a semiconductor device, above a semiconductor substrate of the semiconductor device; form, in an RF portion of the backend region, a layer stack of an RF switch; form a dielectric layer over the layer stack and over a logic portion of the backend region; perform a self-aligned etch operation, without use of a photomask layer, to remove first portions of the dielectric layer from the logic portion and from a top of the layer stack, where second portions of the dielectric layer, that remain on sidewalls of the layer stack, correspond to sidewall spacers of the RF switch; and/or form an interlayer dielectric (ILD) layer, of the backend region, directly on the sidewall spacers and directly on an oxide capping layer of the layer stack of the RF switch, among other examples.

In some implementations, one or more of the semiconductor processing tools 102-112 and/or the wafer/die transport tool 114 may be used to perform one or more semiconductor processing operations described in connection with FIGS. 5A-5E, 6A-4R, 8, and/or 9, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2A:
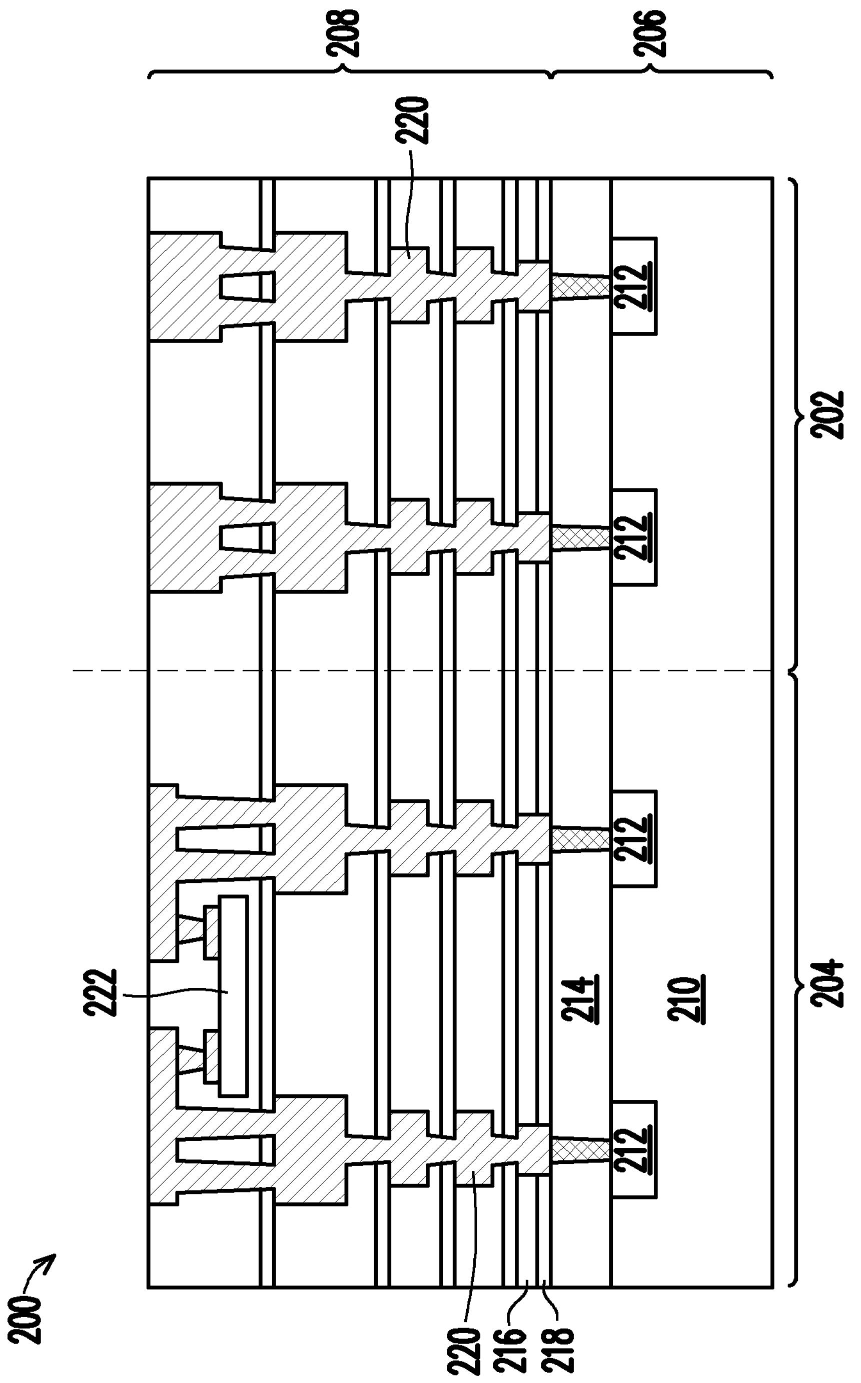
FIGS. 2A and 2B are diagrams of example implementations of an example semiconductor device described herein.
Figure 2B:
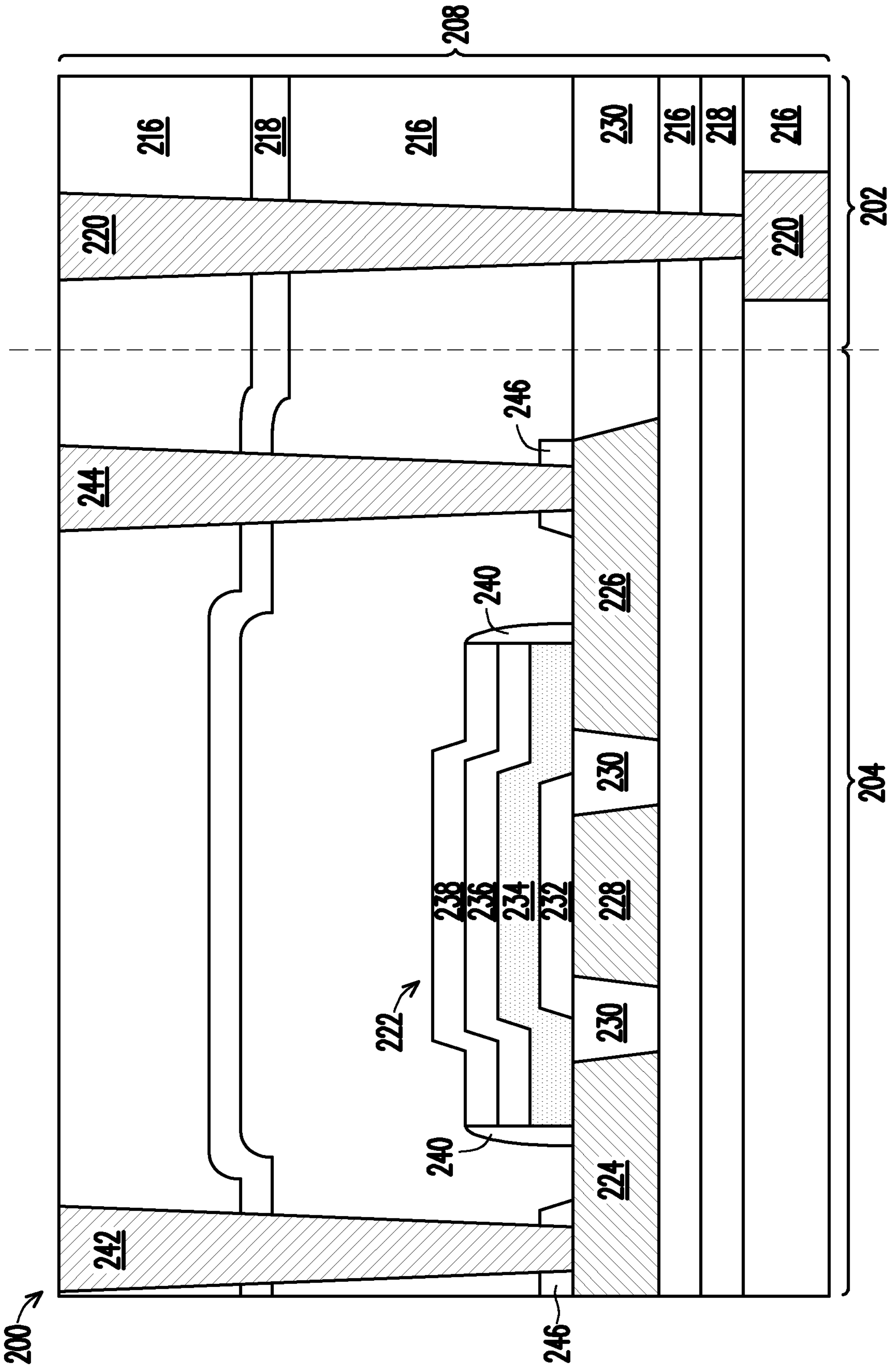

FIGS. 2A and 2B are diagrams of example implementations of an example semiconductor device 200 described herein. In some implementations, the semiconductor device 200 includes a monolithic system on chip (SoC) die that includes a plurality of different functionalities, such as an RF front-end device, a baseband device, and/or another type of wireless communication device. In some implementations, the semiconductor device 200 includes a chiplet, which is a type of semiconductor die that includes a specific subset of functionalities of an overall semiconductor device package. For example, an RF front-end device may include a plurality of chiplets that are packaged on a semiconductor package substrate. A chiplet may correspond to a power amplifier die, a filter die, an RF switch die, an antenna switch die, and/or an antenna tuner die, among other examples. The chiplets may be electrically connected through redistribution layers in the semiconductor package substrate, and/or may be stacked in a system on integrated chips (SoIC) manner such that two or more chiplets are directly bonded and interconnected. Implementing chiplets on a semiconductor package substrate (e.g., as opposed to a monolithic die that includes the entire suite of functionalities) enables advancements to be realized for specific functionalities without having to necessarily redesign semiconductor dies for other functionalities.

As shown in an example implementation of the semiconductor device 200 in FIG. 2A, the semiconductor device 200 includes a logic portion 202 and an RF portion 204 adjacent to the logic portion 202. The logic portion 202 includes logic circuitry of the semiconductor device 200, such as digital processing circuitry, complementary metal oxide semiconductor (CMOS) logic circuitry, and/or other types of logic circuitry. The RF portion 204 includes RF circuitry configured for processing of RF signals. In some implementations, the RF portion 204 includes circuitry configured for processing high-frequency and/or high-bandwidth RF signals, such as signals in the gigahertz (GHz) frequency range or greater (e.g., 60 GHz and greater). In some implementations, the RF portion 204 also includes other types of active devices (e.g., transistors) in addition to the RF circuitry.

As further shown in FIG. 2A, the semiconductor device 200 may include a frontend region 206 (e.g., a front end of line (FEOL) region) and a backend region 208 (e.g., a back end of line (BEOL) region). The frontend region 206 includes the substrate 210 and a plurality of active devices 212 that are included in and/or on the substrate 210. The active devices 212 include transistors (e.g., planar transistors, fin field effect transistors (finFETs), gate all around (GAA) transistors), pixel sensors, photodetectors, transceivers, transmitters, receives, optical circuits, and/or other types of semiconductor devices.

A dielectric layer 214 is included over the substrate 210. The dielectric layer 214 includes an ILD layer, an etch stop layer (ESL), and/or another type of dielectric layer. The dielectric layer 214 includes dielectric material(s) that enable various portions of the substrate 210 and/or the active devices 212 to be selectively etched or protected from etching, and/or to electrically isolate the active devices 212 in the frontend region 206. The dielectric layer 214 includes a silicon nitride ($Si_xN_y$), an oxide (e.g., a silicon oxide ($SiO_x$) and/or another oxide material), and/or another type of dielectric material.

The backend region 208 is included above the substrate 210 and above the active devices 212. The dielectric layers may include dielectric layers 216 and ESLs 218 that are arranged in an alternating manner. The dielectric layers 216 the ESLs 218 may be arranged in a direction that is approximately perpendicular to the substrate 210. The dielectric layers 216 may each include an oxide (e.g., a silicon oxide ($SiO_x$) and/or another oxide material), an undoped silicate glass (USG), a boron-containing silicate glass (BSG), a fluorine-containing silicate glass (FSG), and/or another suitable dielectric material. In some implementations, a dielectric layer 216 includes an ELK dielectric material having a dielectric constant that is less than approximately 2.5. The ESLs 218 may each include a silicon nitride ($Si_xN_y$), silicon carbide (SiC), silicon oxynitride (SiON), and/or another suitable dielectric material. In some implementations, a dielectric layer 216 and an ESL 218 include different dielectric materials to provide etch selectivity to enable various structures to be formed in the backend region 208.

The backend region 208 includes a plurality of metallization layers 220. The metallization layers 220 are electrically coupled and/or physically coupled with one or more of the active devices 212 in the frontend region 206. The metallization layers 220 correspond to circuitry that enables signals and/or power to be provided to and/or from the active devices 212. The metallization layers 220 each include vias, trenches, contacts, plugs, interconnects, and/or other types of conductive structures. The metallization layers 220 each include one or more electrically conductive materials such as tungsten (W), cobalt (Co), ruthenium (Ru), titanium (Ti), aluminum (Al), copper (Cu), gold (Au), and/or a combination thereof, among other examples of electrically conductive materials.

In some implementations, the metallization layers 220 of the backend region 208 may be arranged in in a vertical manner. In other words, a plurality of stacked metallization layers 220 extend between the frontend region 206 and a top of the backend region 208 to facilitate electrical signals and/or power to be routed between the frontend region 206 and the top of the backend region 208. The plurality of stacked metallization layers 220 may be referred to as M-layers. For example, a metal-0 (M0) layer may located at the bottom of the backend region 208 and may be directly coupled with the frontend region 206 (e.g., with the contacts or interconnects of the active devices 212 in the frontend region 206), a metal-1 layer (M1) layer may be located above the M0 layer in the backend region 208, a metal-2 layer (M2) layer may be located above the M1 layer, and so on. In some implementations, the backend region 208 includes nine (9) stacked metallization layers 220 (e.g., M0-M8). In some implementations, the backend region 208 includes another quantity of stacked metallization layers 220.

The backend region 208 includes an RF switch 222 in the RF portion 204. In some implementations, backend region 208 includes other active devices 212, such as a BEOL memory device, a BEOL resistor, a BEOL capacitor, and/or an optical modulator, among other examples, in the logic portion 202 of the semiconductor device 200.

FIG. 2B illustrates a detailed cross-section view of the RF switch 222. The RF switch 222 is an RF switch that operates at high frequencies by selectively transitioning (or switching) between an "on" state and an "off" state. The RF switch 222 may include a phase change material (PCM) RF switch (PCM-RFS) that switches between the on state and the off state by selectively changing a phase of a switching material of the RF switch 222 between a crystalline phase and an amorphous phase.

The RF switch 222 may be included above and/or in a dielectric layer 216 in the RF portion 204 of the backend region 208 of the semiconductor device 200. The dielectric layer 216 may include a silicon oxide ($SiO_x$ such as $SiO_2$), a silicon oxynitride (SiON), and/or another oxide-containing material. Additionally and/or alternatively, the dielectric layer 216 may include another insulating material or another dielectric layer having a suitable thermal conductivity. The dielectric layer 216 may be formed to have a thermal conductivity that is included in a range of approximately 0.1 watts per meter kelvin (W/mk) to approximately 50 W/mk. However, other values for the range are within the scope of the present disclosure. The dielectric layer 216 may be formed to have a horizontal width that is included in a range of approximately 0.1 microns to approximately 2 microns. However, other values for the range are within the scope of the present disclosure. The dielectric layer 216 may be formed to have a horizontal length that is included in a range of approximately 2 microns to approximately 10 microns. However, other values for the range are within the scope of the present disclosure. The dielectric layer 216 may be formed to have a vertical thickness that is included in a range of approximately 0.16 microns to approximately 1.2 microns. However, other values for the range are within the scope of the present disclosure.

The RF switch 222 includes an RF in electrode 224, an RF out electrode 226, and a heater element 228 between the RF in electrode 224 and the RF out electrode 226. The RF in electrode 224, the RF out electrode 226, and the heater element 228 are thermally isolated and/or electrically isolated by a dielectric fill layer 230 that extends across the RF portion 204 and the logic portion 202 of the semiconductor device 200. The RF switch 222 further includes a layer stack over and/or on the RF in electrode 224, the RF out electrode 226, and/or the heater element 228. The layer stack includes a thermal dielectric layer 232 over and/or on the heater element 228, a PCM layer 234 over and/or on the thermal dielectric layer 232, a nitride capping layer 236 over and/or on the PCM layer 234, and/or an oxide capping layer 238 over and/or on the nitride capping layer 236, among other examples.

The RF in electrode 224 and the RF out electrode 226 may be spaced apart by a distance such that RF signals traverse through the PCM layer 234 between the RF in electrode 224 and the RF out electrode 226. The RF in electrode 224 and the RF out electrode 226 may each include one or more conductive materials to enable the RF in electrode 224 and the RF out electrode 226 to conduct RF signals (which may include time-varying electrical signals). Examples of conductive materials include tungsten (W), copper (Cu), cobalt (Co), titanium (Ti), aluminum (Al), ruthenium (Ru), a metal alloy, another conductive metal, and/or another suitable material. The RF in electrode 224 and the RF out electrode 226 may each be formed to have a vertical thickness that is included in a range of approximately 0.05 microns to approximately 0.15 microns. However, other values for the range are within the scope of the present disclosure.

The heater element 228 includes a region of material that is configured to conduct heat. The heater element 228 may include a conductive material having a low Seebeck coefficient and a high melting point (e.g., approximately equal to or greater than 1500 degrees Celsius) such as tungsten (W) or molybdenum (Mo), among other examples. The high melting point enables the heater element 228 to effectively heat the PCM layer 234 to switch the phase of the PCM layer 234 without melting the heater element 228. The heater element 228 may be formed to have a horizontal width that is included in a range of approximately 0.1 microns to approximately 2 microns. However, other values for the range are within the scope of the present disclosure. The heater element 228 may be formed to have a horizontal length that is included in a range of approximately 0.1 microns to approximately 10 microns. However, other values for the range are within the scope of the present disclosure.

The thermal dielectric layer 232 may include an insulating material having a high dielectric constant (e.g., greater than approximately 3.9, among other examples) and/or a high thermal conductivity (e.g., approximately equal to or greater than 100 W/mk, among other examples). The high thermal conductivity may enable heat generated by the heater element 228 to propagate into the PCM layer 234 through the thermal dielectric layer 232, and the high dielectric constant enables the thermal dielectric layer 232 to withstand degradation that might otherwise result from the high operating temperatures of the heater element 228. In some implementations, the thermal dielectric layer 232 includes silicon nitride ($Si_xN_y$ such as $Si_3N_4$) and/or another nitride-containing dielectric material. However, other materials may be used for the thermal dielectric layer 232. The thermal dielectric layer 232 may be formed to have a horizontal width that is included in a range of approximately 5 microns to approximately 20 microns. However, other values for the range are within the scope of the present disclosure. The thermal dielectric layer 232 may be formed to have a horizontal length that is included in a range of approximately 5 microns to approximately 10 microns. However, other values for the range are within the scope of the present disclosure.

The PCM layer 234 may correspond to the switching material of the RF switch 222. The phase of the PCM layer 234 may be switched to selectively permit the propagation of an RF signal from the RF in electrode 224 to the RF out electrode 226 through the PCM layer 234. Thus, the PCM layer 234 functions as the channel of the RF switch 222.

The PCM layer 234 includes one or more materials that are capable of transitioning between two or more material phases or crystal structure phases. In particular, the PCM layer 234 includes one or more materials that are capable of transitioning between a crystalline phase (or crystalline material structure) and an amorphous phase (or non-crystalline material structure). Examples of materials include chalcogenides (alloys containing group VI elements) such as binary chalcogenides, ternary chalcogenides, and/or quaternary chalcogenides, among other examples.

Examples of binary chalcogenides include germanium telluride (GeTe), germanium antimonide (GeSb), gallium antimonide (GaSb), indium antimonide (InSb), antimony telluride ($Sb_xTe_y$ such as $Sb_2Te_3$), and/or indium selenide (InSe), among other examples.

Examples of ternary chalcogenides include germanium antimony tellurium ($Ge_xSb_yTe_z$ such as $Ge_2Sb_2Te_3$), indium antimony tellurium (InSbTe), gallium selenide telluride (GaSeTe), tin antimony telluride ($SnSb_xTe_y$ such as $SnSb_2Te_4$), indium antimony germanium (InSbGe), and/or gallium antimony telluride (GaSbTe), among other examples. For germanium antimony tellurium, the respective concentration of germanium, antimony, and tellurium may be selected to achieve a particular phase transition speed and/or a particular high temperature data retention (HTDR), among other examples.

Examples of quaternary chalcogenides include silver indium antimony tellurium (AgInSbTe), germanium-doped antimony telluride ((Ge)SbTe), tin-doped antimony telluride ((Sn)SbTe), selenide-doped germanium antimonide (GeSb (Se)), tellurium-doped germanium antimonide (GeSb(Te)), tellurium germanium antimony sulfur ($Te_wGe_xSb_yS_z$ such as $Te_{81}Ge_{15}Sb_2S_2$), germanium antimony tellurium with oxygen ($Ge_xSb_yTe_z$:O such as $Ge_2Sb_2Te_5$:O), and/or germanium antimony tellurium with nitrogen ($Ge_xSb_yTe_z$:N such as $Ge_2Sb_2Te_5$:N), among other examples.

The PCM layer 234 may be formed to have a horizontal width such that the PCM layer 234 extends continuously between the RF in electrode 224 and the RF out electrode 226. In some implementations, the horizontal width of the PCM layer 234 is included in a range of approximately 0.1 microns to approximately 10 microns. However, other values for the range are within the scope of the present disclosure. The PCM layer 234 may be formed to have a horizontal length that is included in a range of approximately 0.1 microns to approximately 10 microns. However, other values for the range are within the scope of the present disclosure.

The nitride capping layer 236 and the oxide capping layer 238 are included to protect the PCM layer 234 from contamination from oxygen and/or other contaminants. Moreover, the nitride capping layer 236 and the oxide capping layer 238 may be used as hard mask layers during manufacturing of the RF switch 222. The nitride capping layer 236 and the oxide capping layer 238 may include different types of dielectric materials (e.g., a nitride-containing dielectric material for the nitride capping layer 236 and an oxide-containing material for the oxide capping layer 238) to provide etch selectivity between the nitride capping layer 236 and the oxide capping layer 238. The etch selectivity enables different etchants to be used to etch the nitride capping layer 236 and the oxide capping layer 238, which enables a pattern to be transferred to the nitride capping layer 236 and the oxide capping layer 238, and enables the nitride capping layer 236 and the oxide capping layer 238 to be etched in a highly directional manner.

The nitride capping layer 236 may include a nitride-containing dielectric material such as a silicon nitride ($Si_xN_y$ such as $Si_3N_4$) among other examples. The oxide capping layer 238 may include an oxide-containing dielectric material such as silicon oxide ($SiO_x$) among other examples. The nitride capping layer 236 may be included directly on the PCM layer 234, as opposed to the oxide capping layer 238, because the oxygen in the oxide capping layer 238 might otherwise contaminate the PCM layer 234. Thus, the nitride capping layer 236 being between the PCM layer 234 and the oxide capping layer 238 enables the nitride capping layer 236 to function as an oxygen barrier that prevents the oxygen in the oxide capping layer 238 from contaminating the PCM layer 234.

Sidewall spacers 240 are included on sidewalls of the layer stack of the RF switch 222 and above the RF in electrode 224 and the RF out electrode 226. In particular, the sidewall spacers 240 are included on the sidewalls of the PCM layer 234. The sidewall spacers 240, in combination with the RF in electrode 224, the RF out electrode 226, the heater element 228, and the nitride capping layer 236, enable the PCM layer 234 to be fully encapsulated, thereby protecting the PCM layer 234 from exposure to contamination from oxygen and other contaminants. The sidewall spacers 240 include a dielectric material that does not include an oxide, which prevents the sidewall spacers 240 from contaminating the PCM layer 234 with exposure to oxygen. For example, the sidewall spacers 240 may include a nitride-containing dielectric material such as a silicon nitride ($Si_xN_y$ such as $Si_3N_4$) among other examples.

As further shown in FIG. 2B, the sidewall spacers 240 have a rounded or curved outer surface. The rounded or curved outer surface of the sidewall spacers 240 results from the techniques used to form the sidewall spacers 240. In particular, a dielectric layer is deposited over the RF portion 204 and the logic portion 202 of the semiconductor device 200, and a highly directional (e.g., vertical) etch technique is used to etch a dielectric layer to remove the dielectric layer from the logic portion 202 and from other areas of the RF portion 204 such that the dielectric layer remains only on the sidewalls of the layer stack of the RF switch 222. The rounded or curved outer surface of the sidewall spacers 240 results from the highly directional etch technique that is used to form the sidewall spacers 240. Moreover, removal of the dielectric layer from the logic portion 202 prevents the height or thickness of the logic portion 202 from being unnecessarily increased, which might otherwise increase the likelihood of disconnects between metallization layers 220 in the backend region 208 of the logic portion 202 of the semiconductor device 200.

An RF in interconnect 242 and an RF out interconnect 244 may be included in one or more of the dielectric layers in the backend region 208. The RF in interconnect 242 is electrically coupled and/or physically coupled with the RF in electrode 224 of the RF switch 222. RF signals may be provided to the RF in electrode 224 of the RF switch 222 through the RF in interconnect 242. The RF out interconnect 244 is electrically coupled and/or physically coupled with the RF out electrode 226 of the RF switch 222. RF signals may be provided from the RF out electrode 226 of the RF switch 222 through the RF out interconnect 244. The RF in interconnect 242 and the RF out interconnect 244 may each include trenches, contacts, plugs, interconnects, and/or other types of conductive structures. The RF in interconnect 242 and the RF out interconnect 244 may each include one or more conductive materials. Examples of conductive materials include tungsten (W), copper (Cu), cobalt (Co), titanium (Ti), aluminum (Al), ruthenium (Ru), a metal alloy, another conductive metal, and/or another suitable material.

Isolation layers 246 may be included around the RF in interconnect 242 and the RF out interconnect 244. The isolation layers 246 may provide electrical isolation for the RF in interconnect 242 and for the RF out interconnect 244. The isolation layers 246 may include a silicon nitride ($Si_xN_y$), an oxide (e.g., a silicon oxide ($SiO_x$) and/or another oxide material), and/or another type of dielectric material.

As indicated above, FIGS. 2A and 2B are provided as examples. Other examples may differ from what is described with regard to FIGS. 2A and 2B.

Figure 3A:
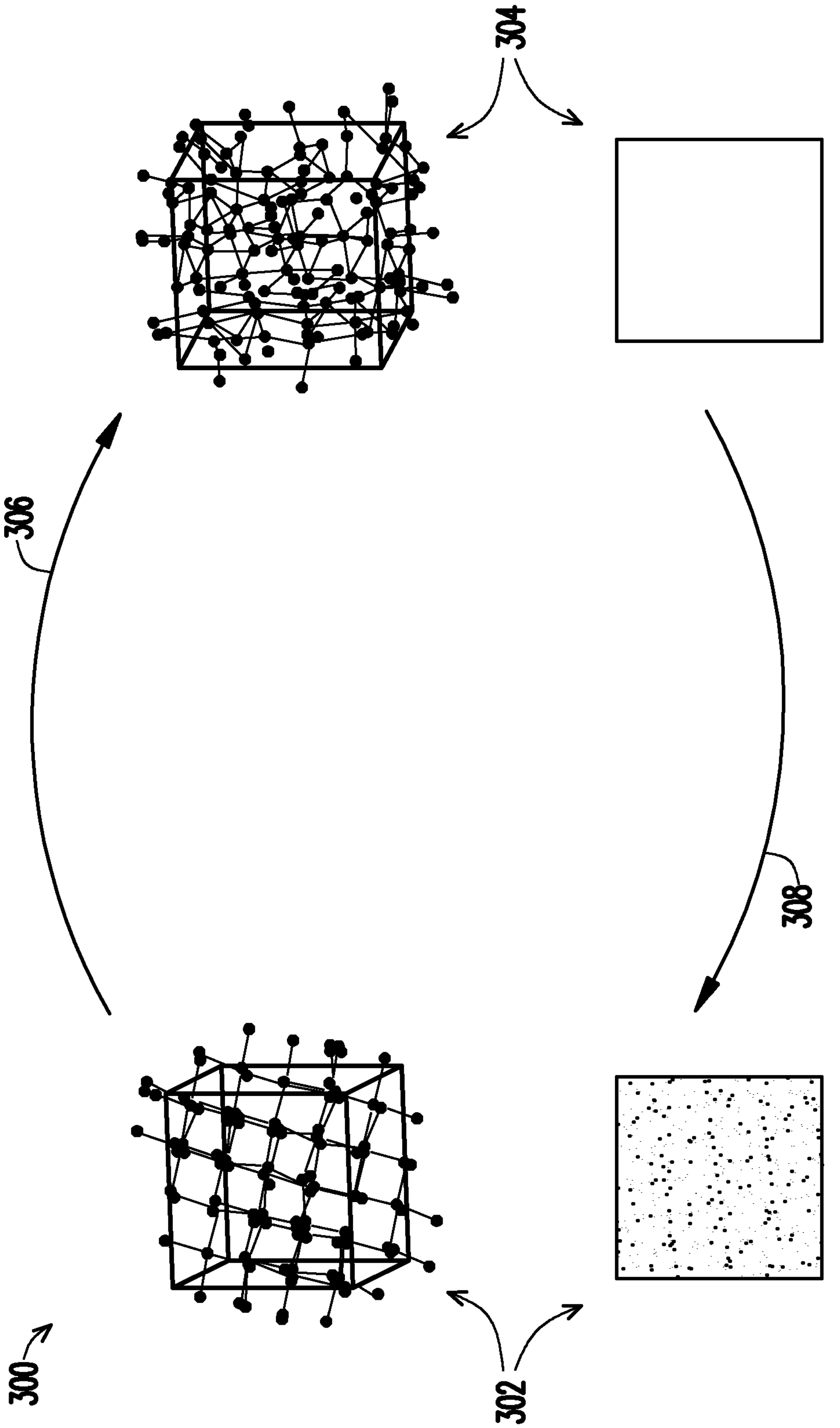
FIGS. 3A-3C are diagrams of example implementations of operation of a radio frequency (RF) switch described herein.
Figure 3B:
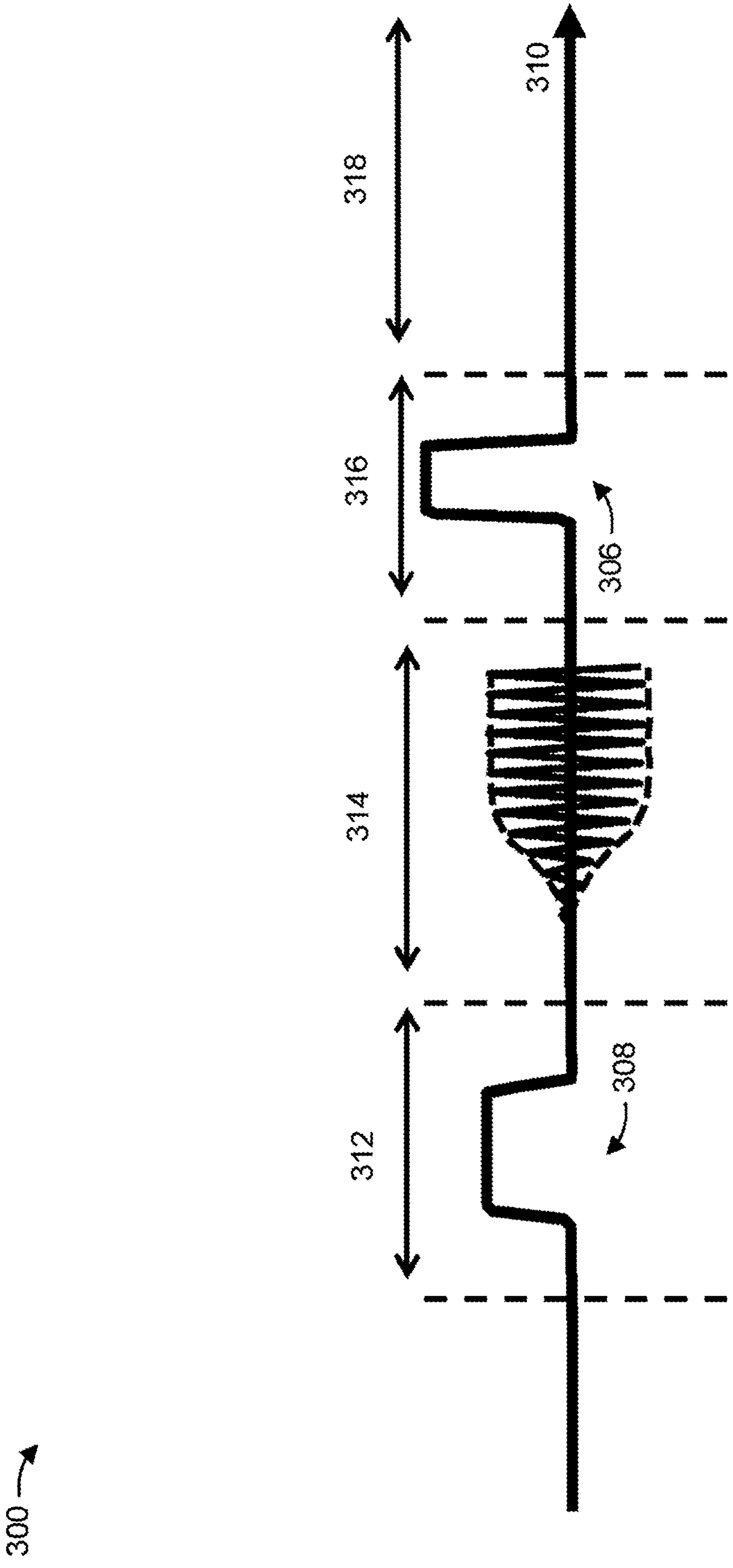
Figure 3C:
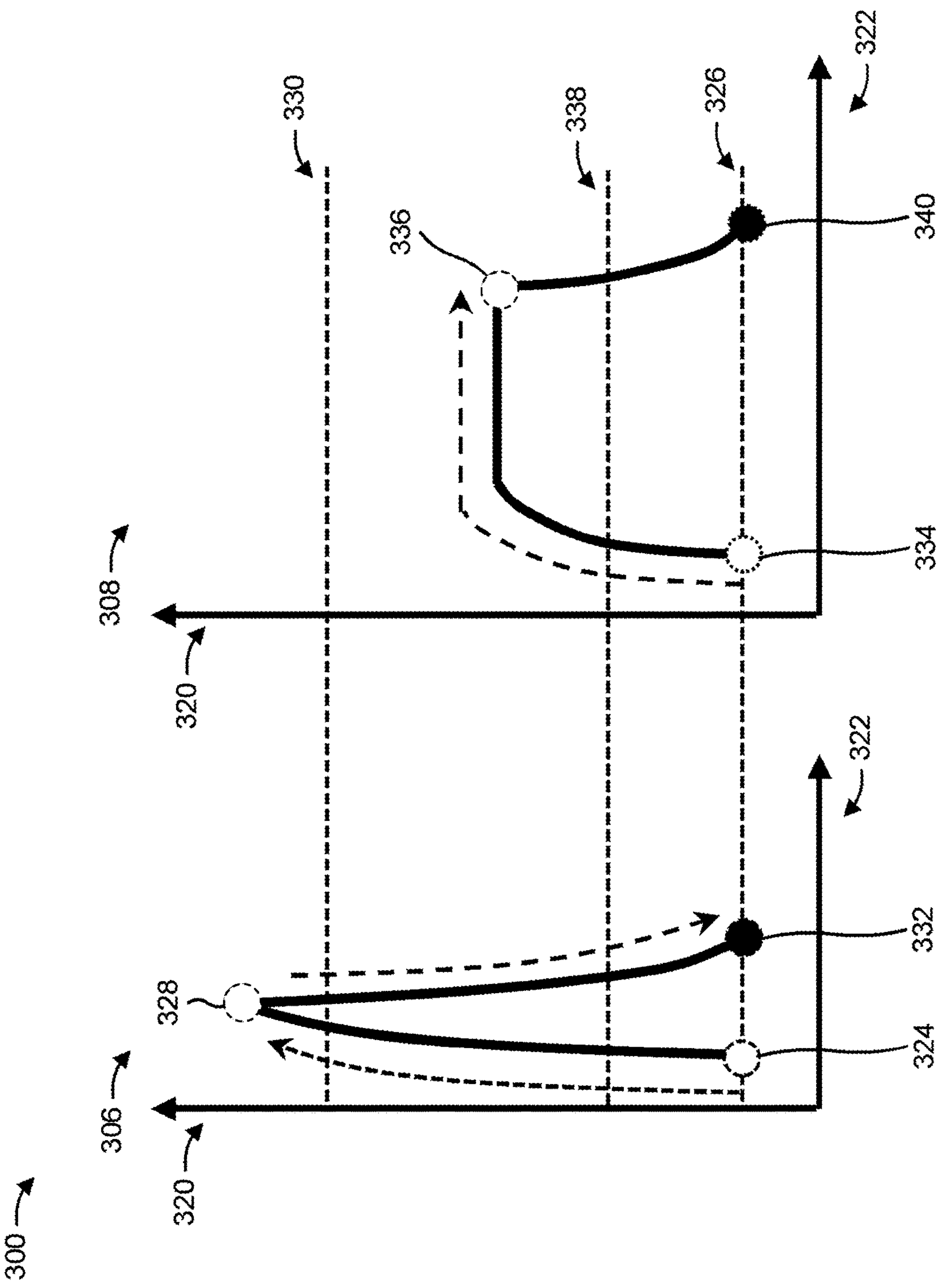

FIGS. 3A-3C are diagrams of example implementations 300 of the operation of the RF switch 222 described herein.

As shown in FIG. 3A, the PCM layer 234 of the RF switch 222 may be transitioned between a crystalline phase 302 and an amorphous phase 304. In the crystalline phase 302, the material structure of the PCM layer 234 is arranged in an ordered and approximately crystalline structure. In the amorphous phase 304, the material structure of the PCM layer 234 is non-crystalline and/or disordered. The crystalline phase 302 may correspond to the on state of the RF switch 222. In the crystalline phase 302, the PCM layer 234 has relatively low resistivity (e.g., relative to the resistivity in the off state), which enables RF signals to propagate through the PCM layer 234. The amorphous phase 304 may correspond to the off state of the RF switch 222. In the amorphous phase 304, the PCM layer 234 has relatively high resistivity (e.g., relative to the resistivity in the on state), which prevents RF signals from propagating through the PCM layer 234 between the RF in electrode 224 and the RF out electrode 226.

As further shown in FIG. 3A, a reset operation 306 may be performed to transition the PCM layer 234 from the crystalline phase 302 to the amorphous phase 304. A set operation 308 may be performed to transition the PCM layer 234 from the amorphous phase 304 to the crystalline phase 302. The reset operation 306 and the set operation 308 may each include providing a current ($I_{heater}$) to the heater element 228 to cause the heater element 228 to heat (increase the temperature of) the PCM layer 234 to a particular temperature and for a particular time duration.

As shown in FIG. 3B, the set operation 308 may be performed for a transition period 312 along a timeline 310 to transition the RF switch 222 to the on state. In the on state, RF signals may propagate through the PCM layer 234 from the RF in electrode 224 to the RF out electrode 226. In an example use case, an RF signal may propagate from a modem of a wireless communication device to an antenna of the wireless communication device through the RF switch 222 during a signal transmission period 314 so that the RF signal may be wirelessly transmitted. Subsequently, the reset operation 306 may be performed for a transition period 316 to transition the RF switch 222 from the on state to the off state. In the off state, the PCM layer 234 blocks the propagation of RF signals between the RF in electrode 224 to the RF out electrode 226 for an off duration 318.

FIG. 3C illustrates example temperature profiles for the reset operation 306 and for the set operation 308. The temperature profiles are illustrated as a function of the temperature 320 of the PCM layer 234 and time 322.

In the temperature profile for the reset operation 306, the temperature 320 of the PCM layer 234 may be at a starting temperature 324, which may correspond to a baseline temperature 326 (e.g., room temperature or a baseline operating temperature of the RF switch 222 with the heater element 228 off). The heater element 228 is subsequently activated by providing a current to the heater element 228, which causes the heater element 228 to generate heat and increase in temperature. The heat generated by the heater element 228 causes the temperature 320 of the PCM layer 234 to also increase from the starting temperature 324.

In the reset operation 306, the temperature 320 of the PCM layer 234 is quickly and rapidly increases to a reset temperature 328. The reset temperature 328 is greater than a melting temperature 330 of the PCM layer 234. Heating the PCM layer 234 such that the temperature 320 of the PCM layer 234 increases to greater than the melting temperature 330 of the PCM layer 234 causes the material of the PCM layer 234 to melt. An example of the melting temperature 330 may be approximately 1000 degrees kelvin. However, other values for the melting temperature 330 are within the scope of the present disclosure.

The heater element 228 is subsequently deactivated, and the material of the PCM layer 234 is quenched such that the temperature 320 of the PCM layer 234 rapidly decreases back to an ending temperature 332 corresponding to the baseline temperature 326. The rapid heating (above the melting temperature 330) and cooling of the PCM layer 234 causes the material of the PCM layer 234 to transition from the crystalline phase 302 to the amorphous phase 304.

In the temperature profile for the set operation 308, the temperature 320 of the PCM layer 234 may be at a starting temperature 334, which may correspond to a baseline temperature 326 (e.g., room temperature or a baseline operating temperature of the RF switch 222 with the heater element 228 off). The heater element 228 is subsequently activated by providing a current to the heater element 228, which causes the heater element 228 to generate heat and increase in temperature. The heat generated by the heater element 228 causes the temperature 320 of the PCM layer 234 to also increase from the starting temperature 334.

In the set operation 308, the temperature 320 of the PCM layer 234 is increased to and maintained at a set temperature 336. The PCM layer 234 is maintained at the set temperature 336 for a greater time duration than the reset temperature 328. For example, the time duration of the set operation 308 may be on the order of a few microseconds (e.g., 1-5 microsections), whereas the time duration of the reset operation 306 may be on the order of nanoseconds (e.g., 100-200 nanoseconds). The set temperature 336 is less than the reset temperature 328. In particular, the set temperature 336 is greater than a crystallization temperature 338 of the material of the PCM layer 234 and less than the melting temperature 330 of the material of the PCM layer 234. An example of the crystallization temperature 338 may be approximately 500 degrees kelvin. However, other values for the crystallization temperature 338 are within the scope of the present disclosure. A greater voltage magnitude may be applied to the heater element 228 to heat the PCM layer 234 to a greater temperature in the reset operation 306 relative to the voltage magnitude that is applied to the heater element 228 to heat the PCM layer 234 in the set operation 308.

Heating the PCM layer 234 such that the temperature 320 of the PCM layer 234 increases to greater than the crystallization temperature 338 and less than the melting temperature 330 causes the material of the PCM layer 234 to crystalize (or recrystallize), which causes the material of the PCM layer 234 to transition from the amorphous phase 304 to the crystalline phase 302. The heater element 228 is subsequently deactivated, and the material of the PCM layer 234 is quenched such that the temperature 320 of the PCM layer 234 decreases to an ending temperature 340 that corresponds to the baseline temperature 326.

As indicated above, FIGS. 3A-3C are provided as examples. Other examples may differ from what is described with regard to FIGS. 3A-3C.

Figure 4A:
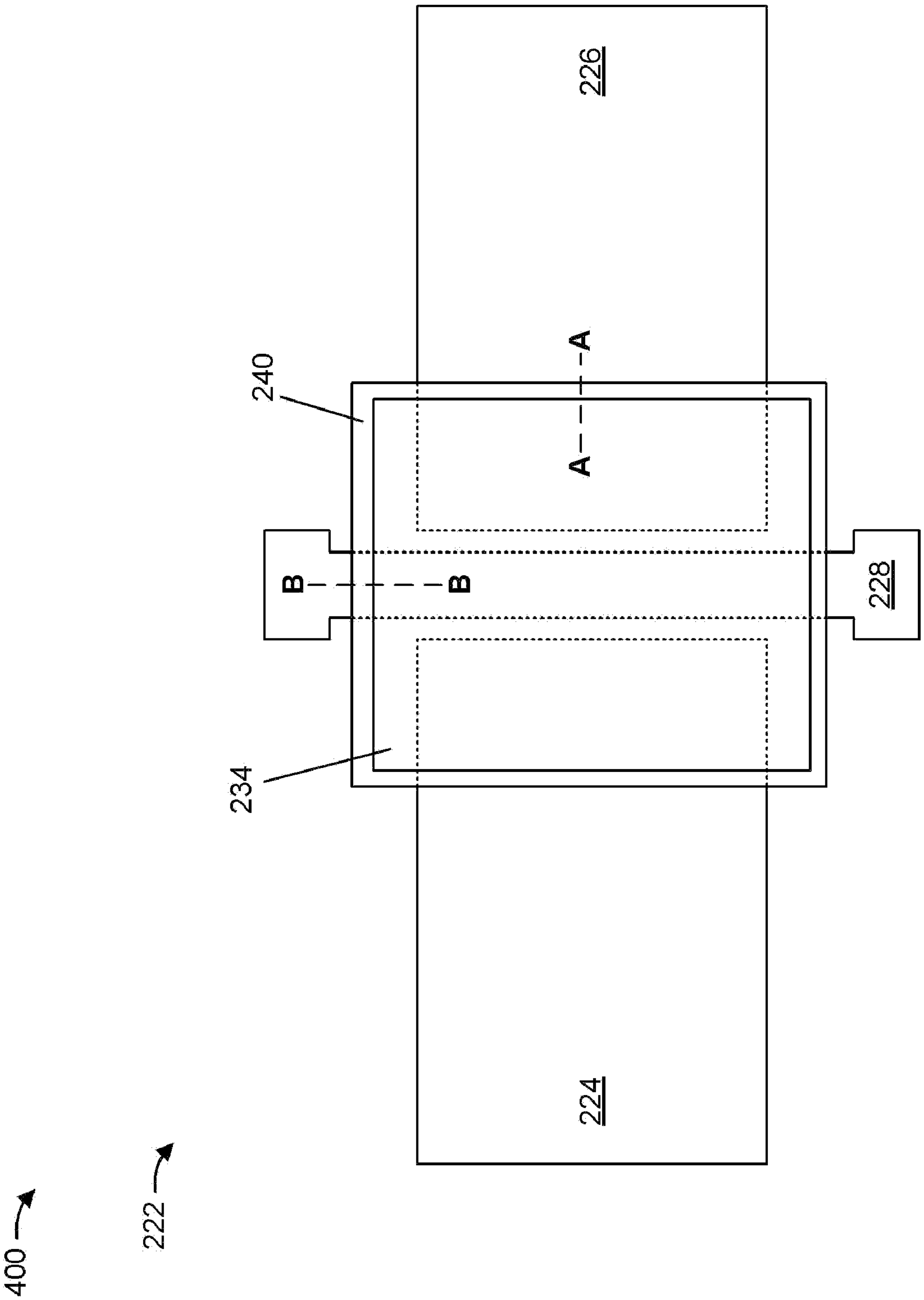
FIGS. 4A-4C are diagrams of an example implementation of an RF switch described herein.
Figure 4B:
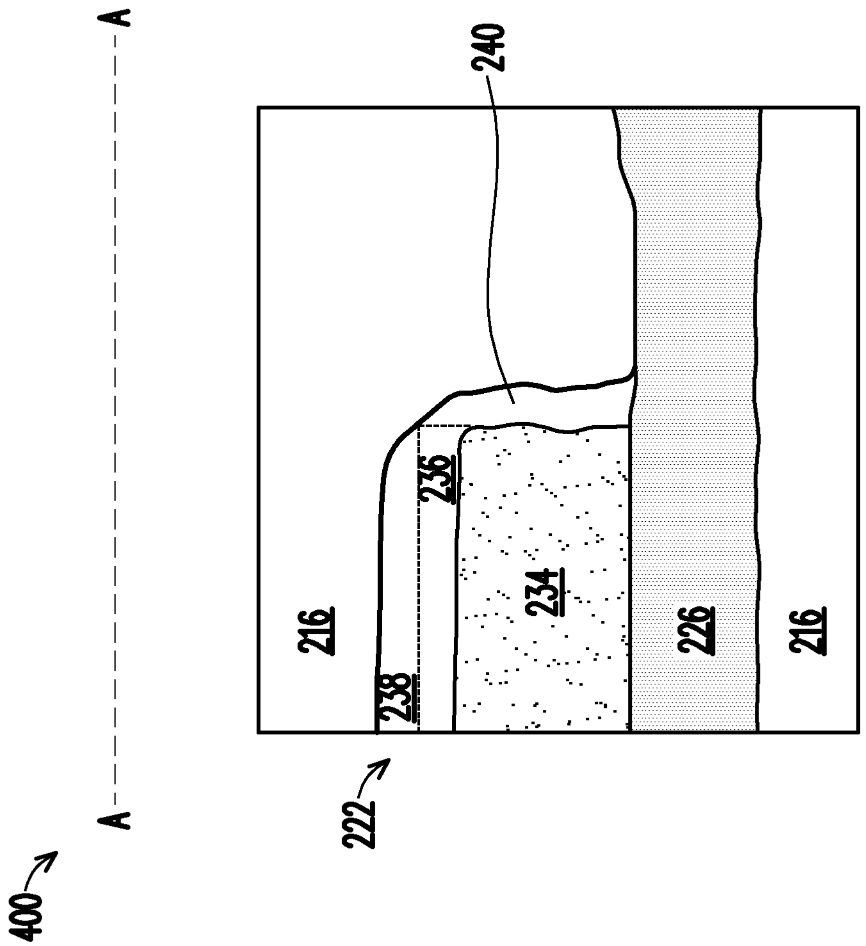
Figure 4C:
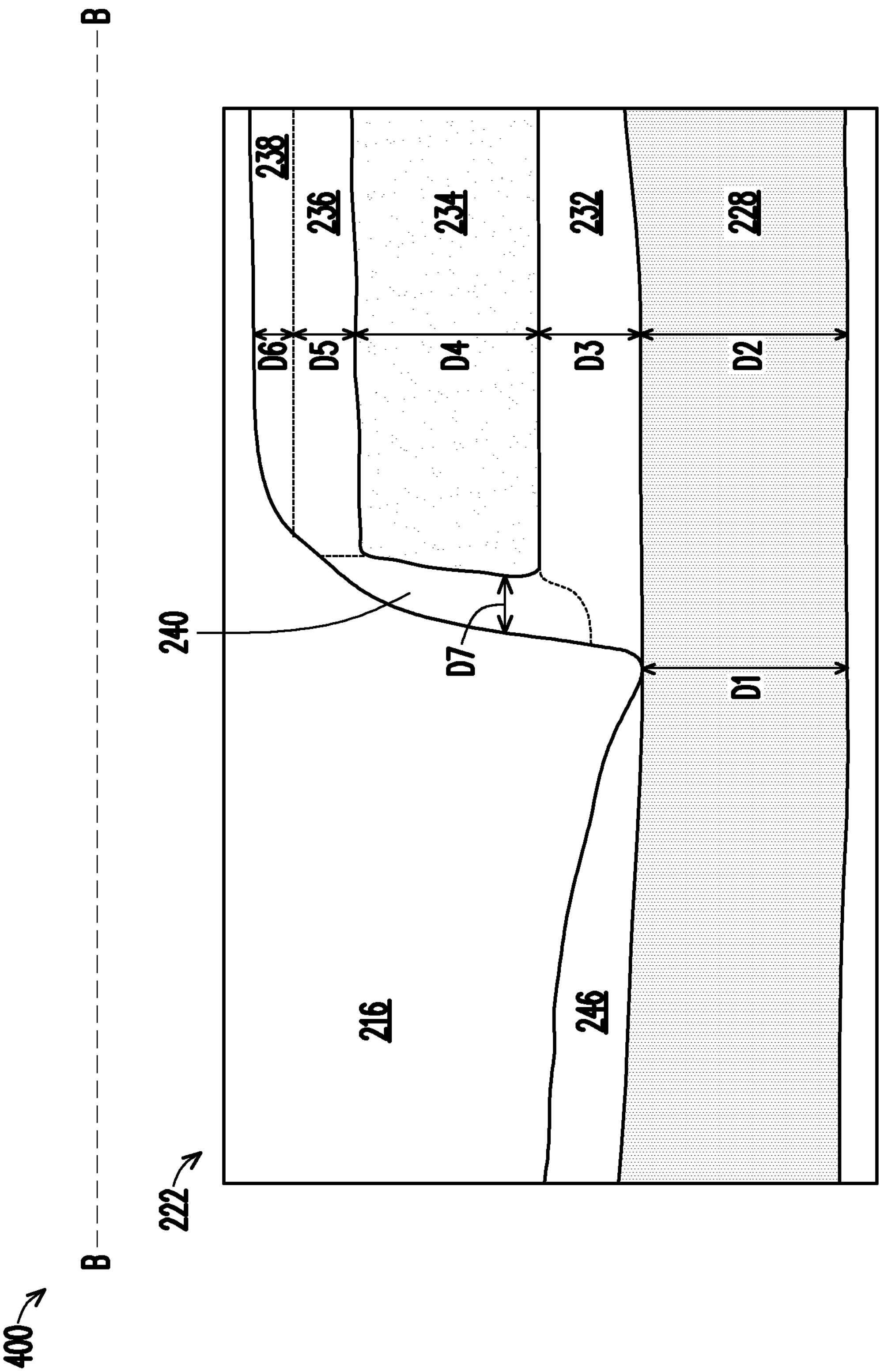

FIGS. 4A-4C are diagrams of an example implementation 400 of the RF switch 222 described herein.

FIG. 4A illustrates a top-down view of the RF switch 222. As shown in FIG. 4A, the RF in electrode 224 and the RF out electrode 226 extend in a first direction (e.g., an x-direction) in the top-down view of the RF switch 222. The heater element 228 extends in a second direction (e.g., a y-direction) in the top-down view of the RF switch 222. The first direction and the second direction are approximately perpendicular. The PCM layer 234 is included over a portion of the RF in electrode 224, a portion of the RF out electrode 226, and a portion of the heater element 228. In the top-down view of the RF switch 222, the sidewall spacer 240 is included around the perimeter of the PCM layer 234 such that the sidewall spacer 240 fully seals the sidewalls of the PCM layer 234 and protects the PCM layer 234 from exposure to contamination from oxygen and other contaminants.

FIG. 4B illustrates a cross-section view of the RF switch 222 along the line A-A in FIG. 4A. As shown in FIG. 4B, the RF out electrode 226 extends laterally outward past the side of the PCM layer 234 in the cross-section view along the line A-A. The RF in electrode 224 extends laterally outward past the side of the PCM layer 234 in a similar manner. The sidewall spacer 240 (e.g., a bottom surface of the sidewall spacers 240) is located on the sidewall of the PCM layer 234 in the cross-section view along the line A-A. The sidewall spacer 240 is also located on a portion of the RF out electrode 226 that extends laterally outward past the side of the PCM layer 234. While not shown in FIG. 4B, the sidewall spacer 240 is also located on a portion of the RF in electrode 224 that extends laterally outward past the side of the PCM layer 234. In this way, the RF in electrode 224, the RF out electrode 226, the nitride capping layer 236, and the sidewall spacer 240 fully encapsulate the PCM layer 234, thereby protecting the PCM layer 234 from exposure to contamination from oxygen and other contaminants.

FIG. 4C illustrates another cross-section view of the RF switch 222 along the line B-B in FIG. 4A. As shown in FIG. 4C, the heater element 228 extends laterally outward past the side of the PCM layer 234 in the cross-section view along the line B-B. Moreover, the thermal dielectric layer 232 also extends laterally outward past the side of the PCM layer 234 in the cross-section view along the line B-B. The sidewall spacer 240 is located on the sidewall of the PCM layer 234 (e.g., adjacent to the sidewall of the PCM layer 234 in the cross-section view along the line A-A) in the cross-section view along the line B-B. The sidewall spacer 240 (e.g., a bottom surface of the sidewall spacers 240) is also located on the portion of the thermal dielectric layer 232 that extends laterally outward past the side of the PCM layer 234, as opposed to being located on the RF in electrode 224 and RF out electrode 226 (e.g., as in the cross-section view along the line A-A). In this way, the heater element 228, the nitride capping layer 236, and the sidewall spacer 240 fully encapsulate the PCM layer 234, thereby protecting the PCM layer 234 from exposure to contamination from oxygen and other contaminants.

FIG. 4C further illustrates one or more dimensions of the RF switch 222. An example dimension D1 corresponds to a thickness (e.g., a vertical thickness) of the heater element 228 at the end of the PCM layer 234 on which the sidewall spacer 240 is located. Another example dimension D2 corresponds to a thickness (e.g., a vertical thickness) of the heater element 228 under the PCM layer 234. In some implementations, the dimensions D1 and D2 are included in a range of approximately 500 angstroms to approximately 1500 angstroms. However, other values for the range are within the scope of the present disclosure. If the dimensions D1 and D2 are less than approximately 500 angstroms, the heater element 228 may not be able to sufficiently heat the PCM layer 234 to facilitate phase transitions in the PCM layer 234. If the dimensions D1 and D2 are greater than approximately 1500 angstroms, the heat provided by the heater element 228 may be too high and may damage the PCM layer 234. If the dimensions D1 and D2 are included in the range of approximately 500 angstroms to approximately 1500 angstroms, the heater element 228 may provide an optimal amount of heat to the PCM layer 234. However, other values for the dimensions D1 and D2, and ranges other than approximately 500 angstroms to approximately 1500 angstroms, are within the scope of the present disclosure.

Another example dimension D3 corresponds to a thickness (e.g., a vertical thickness) of the thermal dielectric layer 232. In some implementations, the dimension D3 is included in a range of approximately 200 angstroms to approximately 600 angstroms. However, other values for the range are within the scope of the present disclosure.

Another example dimension D4 corresponds to a thickness (e.g., a vertical thickness) of the PCM layer 234. In some implementations, the dimension D4 is included in a range of approximately 500 angstroms to approximately 1500 angstroms. If the dimension D4 is less than approximately 500 angstroms, the PCM layer 234 may have too-high impedance and may result in RF signal loss in the RF switch 222. If the dimension D4 is greater than approximately 1500, the PCM layer 234 may be too thick to fully transition between crystallized and amorphous states. If the dimension D4 is included in the range of approximately 500 angstroms to approximately 1500 angstroms, the PCM layer 234 may be able to transition between crystallized and amorphous states while achieving a sufficiently low impedance for the PCM layer 234. However, other values for the dimension D4, and ranges other than approximately 500 angstroms to approximately 1500 angstroms, are within the scope of the present disclosure.

Another example dimension D5 corresponds to a thickness (e.g., a vertical thickness) of the nitride capping layer 236. In some implementations, the dimension D5 is included in a range of approximately 200 angstroms to approximately 500 angstroms. If the dimension D5 is less than approximately 200 angstroms, the nitride capping layer 236 may not effectively protect the top surface of the PCM layer 234 from oxygen contamination. If the dimension D5 is greater than approximately 500 angstroms, processing time and etchant consumption for forming the RF switch 222 may be unnecessarily increased. If the dimension D5 is included in the range of approximately 200 angstroms to approximately 500 angstroms, the nitride capping layer 236 may effectively protect the top surface of the PCM layer 234 from oxygen contamination while enabling a sufficiently low processing time and etchant consumption for forming the RF switch 222 to be achieved. However, other values for the dimension D5, and ranges other than approximately 200 angstroms to approximately 500 angstroms, are within the scope of the present disclosure.

Another example dimension D6 corresponds to a thickness (e.g., a vertical thickness) of the oxide capping layer 238. In some implementations, the dimension D6 is included in a range of greater than 0 angstroms to approximately 1000 angstroms. However, other values for the range are within the scope of the present disclosure.

Another example dimension D7 corresponds to a thickness (e.g., a lateral thickness) of the sidewall spacers 240. In some implementations, the dimension D7 is included in a range of approximately 200 angstroms to approximately 500 angstroms. If the dimension D7 is less than approximately 200 angstroms, the sidewall spacers 240 may not effectively protect the sidewalls of the PCM layer 234 from oxygen contamination. If the dimension D7 is greater than approximately 500 angstroms, processing time and etchant consumption for forming the sidewall spacers 240 may be unnecessarily increased. If the dimension D7 is included in the range of approximately 200 angstroms to approximately 500 angstroms, the sidewall spacers 240 may effectively protect the sidewalls of the PCM layer 234 from oxygen contamination while enabling a sufficiently low processing time and etchant consumption for forming the sidewall spacers 240 to be achieved. However, other values for the dimension D7, and ranges other than approximately 200 angstroms to approximately 500 angstroms, are within the scope of the present disclosure.

As indicated above, FIGS. 4A-4C are provided as examples. Other examples may differ from what is described with regard to FIGS. 4A-4C.

FIGS. 5A-5E are diagrams of an example implementation 500 of forming a semiconductor device 200 described herein. In some implementations, one or more of the semiconductor processing tools 102-112 and/or the wafer/die transport tool 114 may be used to perform one or more of the semiconductor processing operations described in connection with FIGS. 5A-5E. In some implementations, one or more of the semiconductor processing operations described in connection with FIGS. 5A-5E may be performed using another semiconductor processing tool.

Figure 5A:
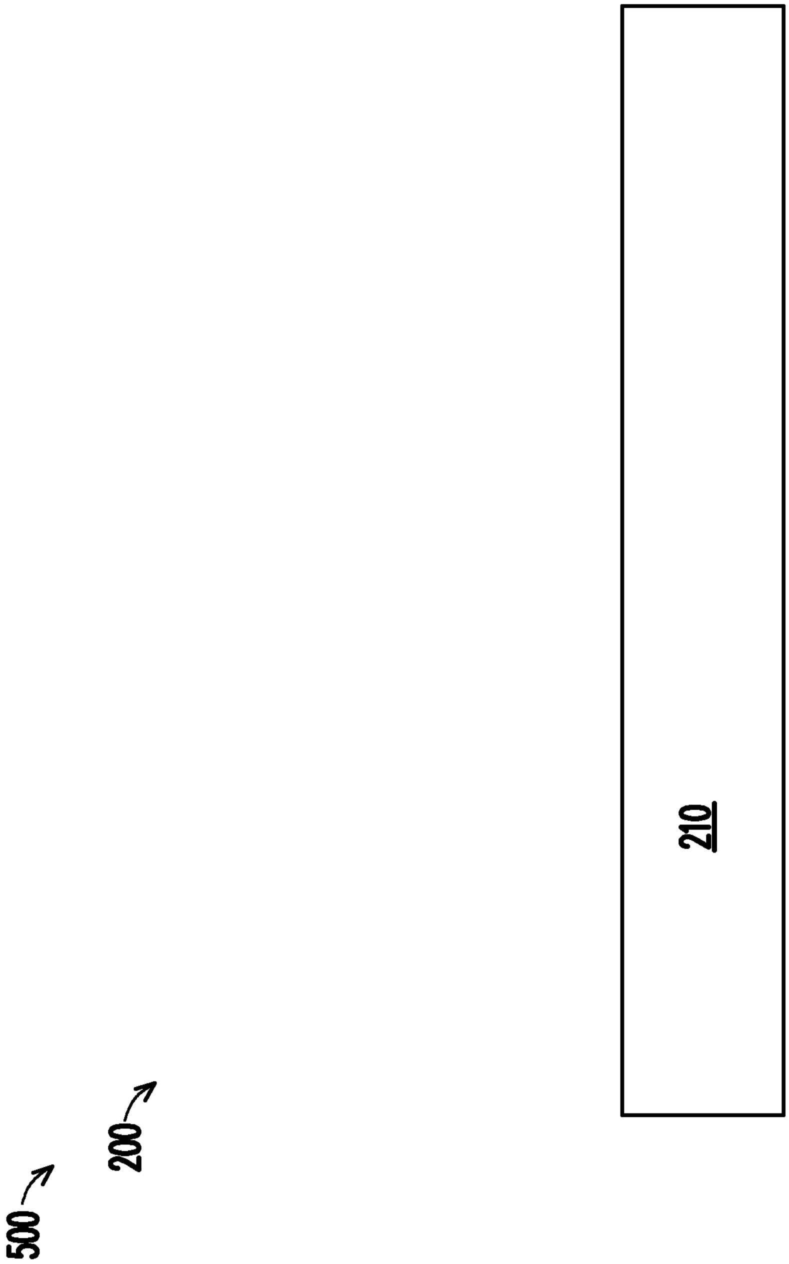
FIGS. 5A-5E are diagrams of an example implementation of forming a semiconductor device described herein.

Turning to FIG. 5A, the substrate 210 is provided. The substrate 210 may be provided in the form of a semiconductor wafer such as a silicon (Si) wafer, a silicon on insulator (SOI) wafer, and/or another type of semiconductor workpiece.

Figure 5B:
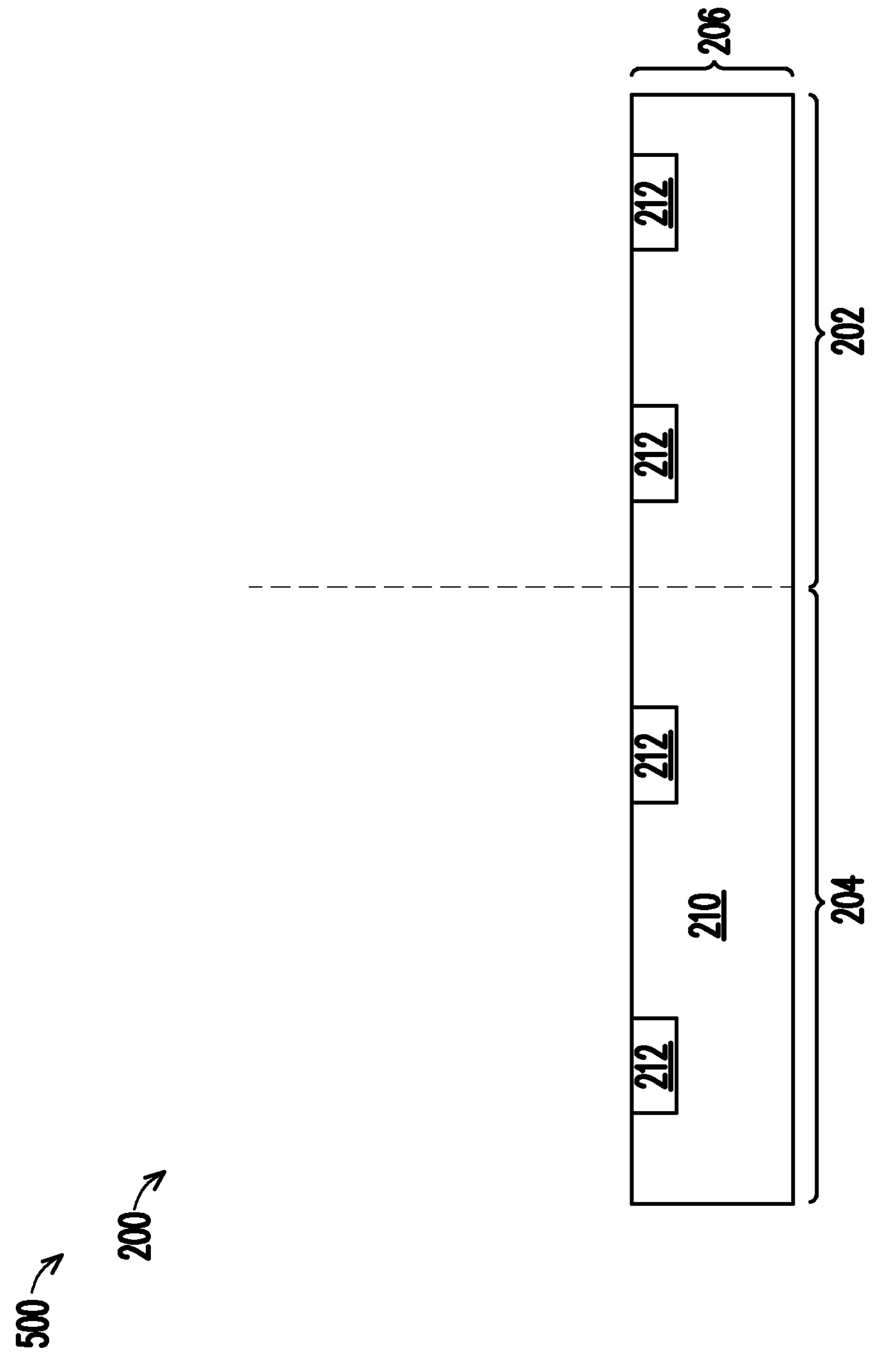

As shown in FIG. 5B, the active devices 212 may be formed in and/or on the substrate 210 in the frontend region 206 of the semiconductor device 200. The active devices 212 are formed in the logic portion 202 of the semiconductor device 200 and, in some implementations, also in the RF portion 204 of the semiconductor device 200. Alternatively, the active devices 212 may be omitted from the RF portion 204 of the semiconductor device 200.

One or more of the semiconductor processing tools 102-114 may be used to form one or more portions of the active devices 212. For example, a deposition tool 102 may be used to perform various deposition operations to deposit layers of the active devices 212, and/or to deposit photoresist layers for etching the substrate 210 and/or portions of the deposited layers. As another example, an exposure tool 104 may be used to expose the photoresist layers to form patterns in the photoresist layers. As another example, a developer tool 106 may develop the patterns in the photoresist layers. As another example, an etch tool 108 may be used to etch the substrate 210 and/or portions of the deposited layers to form the active devices 212. As another example, a planarization tool 110 may be used to planarize portions of the active devices 212. As another example, a plating tool 112 may be used to deposit metal structures and/or layers of the active devices 212.

Figure 5C:
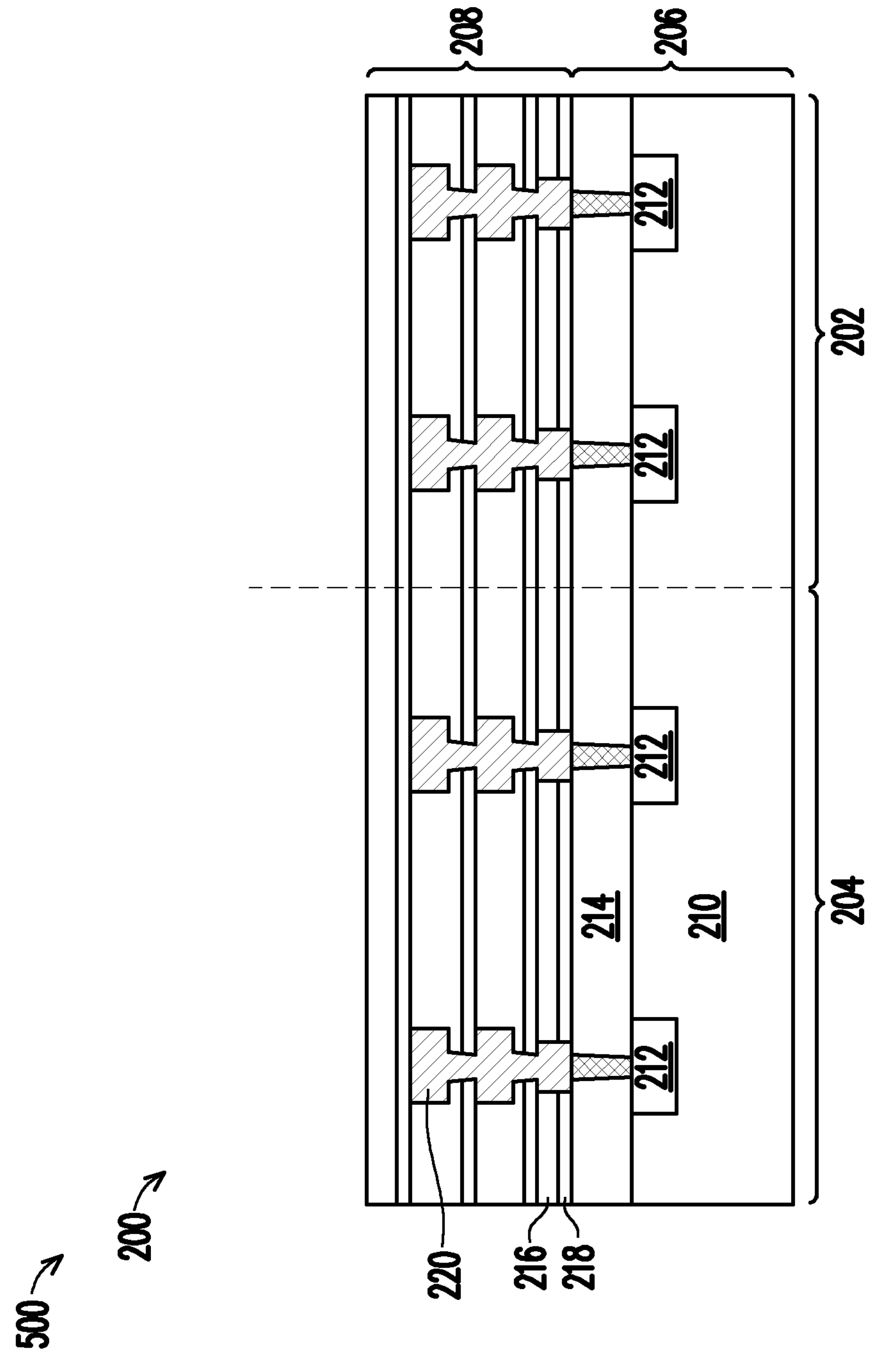

As shown in FIG. 5C, a deposition tool 102 is used to deposit the dielectric layer 214 over and/or on the substrate 210 and over and/or on the active devices 212. A first portion of the backend region 208 of the semiconductor device 200 is then formed over the dielectric layer 214. A deposition tool 102 is used to deposit alternating layers of ESLs 218 and dielectric layers 216 of the first portion of the backend region 208 of the semiconductor device 200. A deposition tool 102, an exposure tool 104, a developer tool 106, an etch tool 108, a planarization tool 110, and/or a plating tool 112 are used to perform various operations to form the metallization layers 220 in the first portion of the backend region 208 of the semiconductor device 200. The metallization layers 220 may be included in the dielectric layers 216 and/or the ESLs 218, and may be electrically coupled with the active devices 212 in the frontend region 206.

Figure 5D:
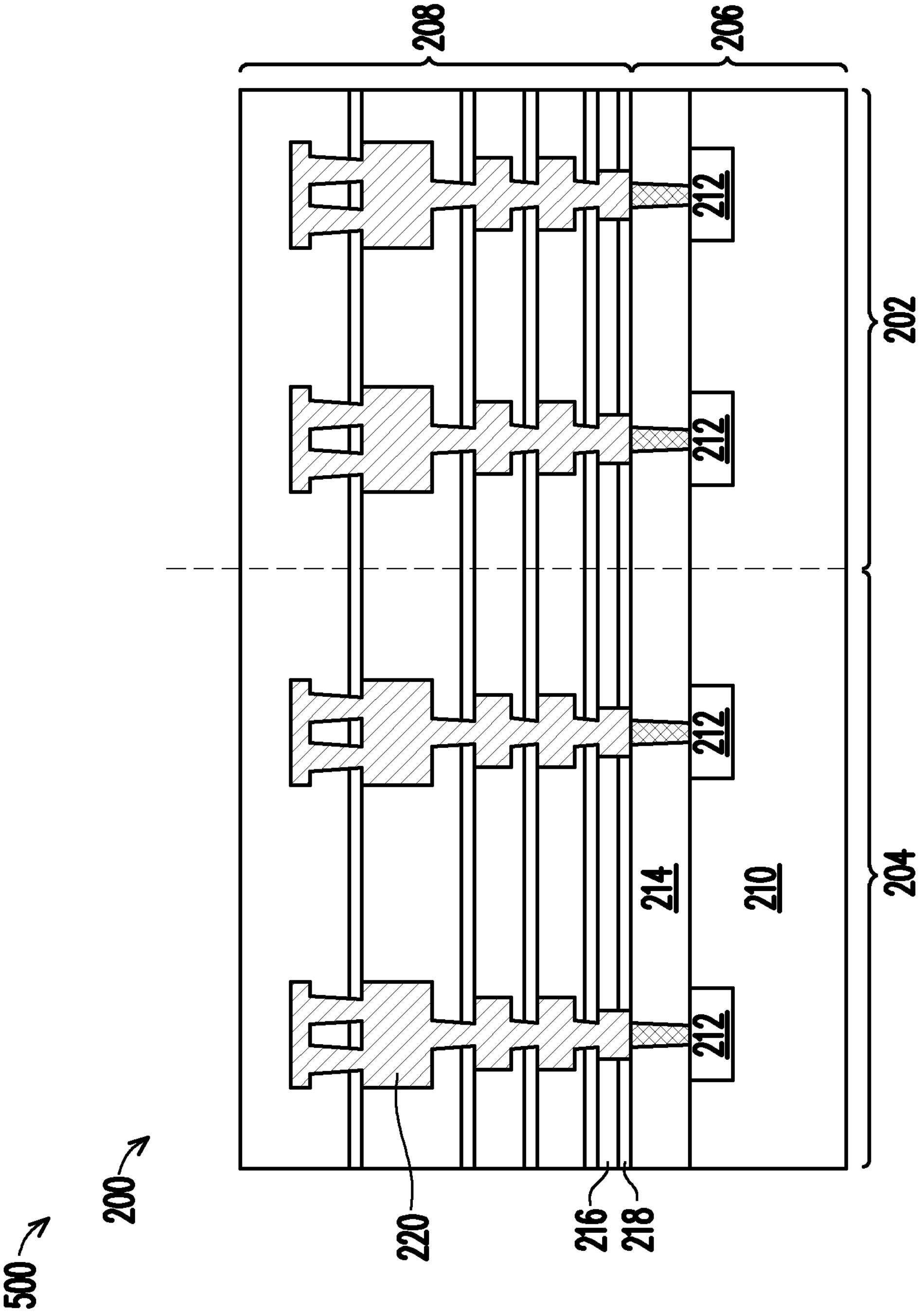

As shown in FIG. 5D, a second portion of the backend region 208 of the semiconductor device 200 is then formed over the first portion of the backend region 208. A deposition tool 102 is used to deposit alternating layers of ESLs 218 and dielectric layers 216 of the second portion of the backend region 208 of the semiconductor device 200. A deposition tool 102, an exposure tool 104, a developer tool 106, an etch tool 108, a planarization tool 110, and/or a plating tool 112 are used to perform various operations to form the metallization layers 220 in the second portion of the backend region 208 of the semiconductor device 200. The metallization layers 220 may be included in the dielectric layers 216 and/or the ESLs 218.

Figure 5E:
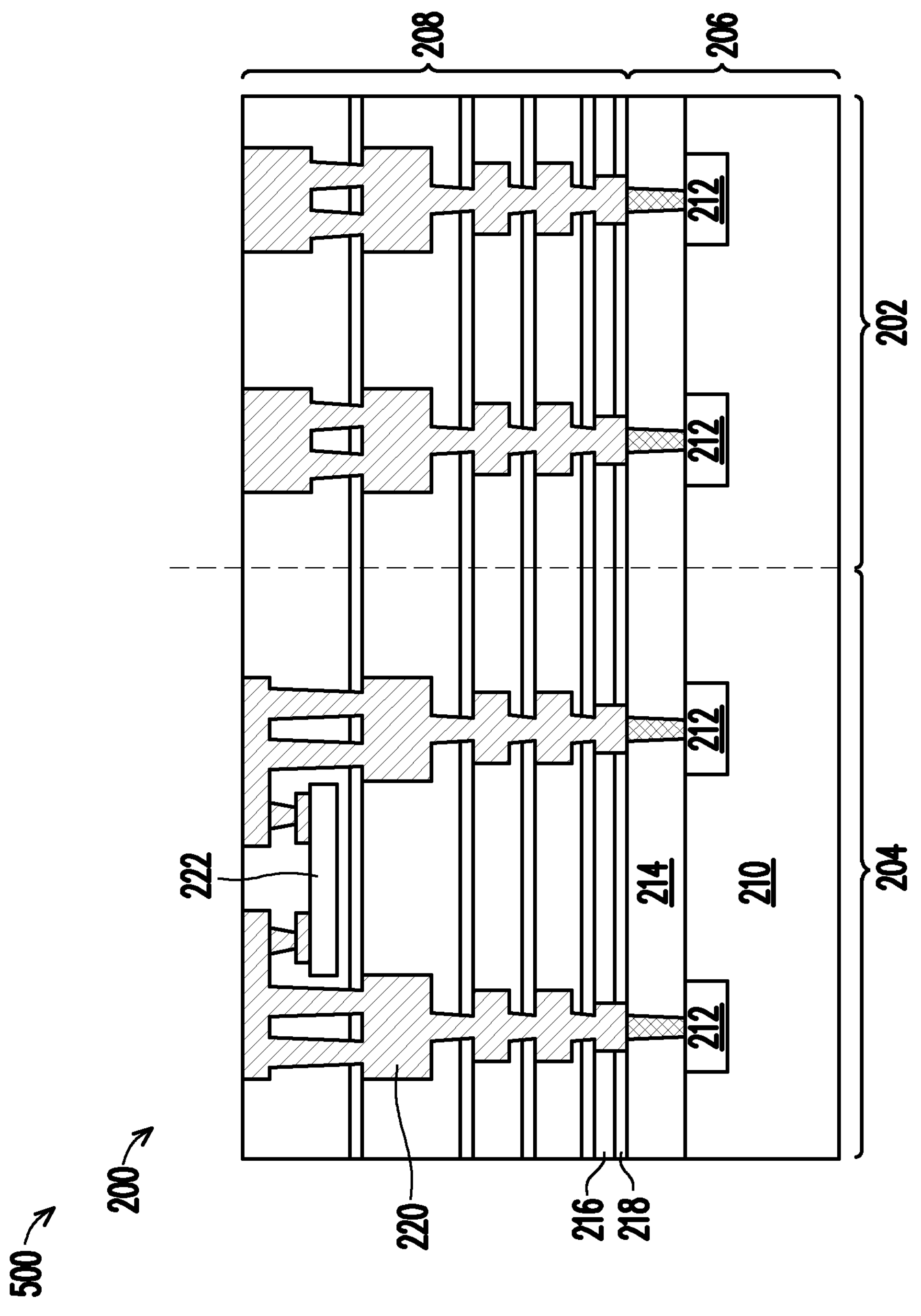

As shown in FIG. 5E, the RF switch 222 is formed in the RF portion 204 of the backend region 208 and electrically coupled and/or physically coupled to one or more metallization layers 220 in the backend region 208. The RF switch 222 may be formed in a dielectric layer 216 of the backend region 208. An example implementation of forming the RF switch 222 is described in connection with FIGS. 6A-6R.

As indicated above, FIGS. 5A-5E are provided as examples. Other examples may differ from what is described with regard to FIGS. 5A-5E.

Figure 6A:
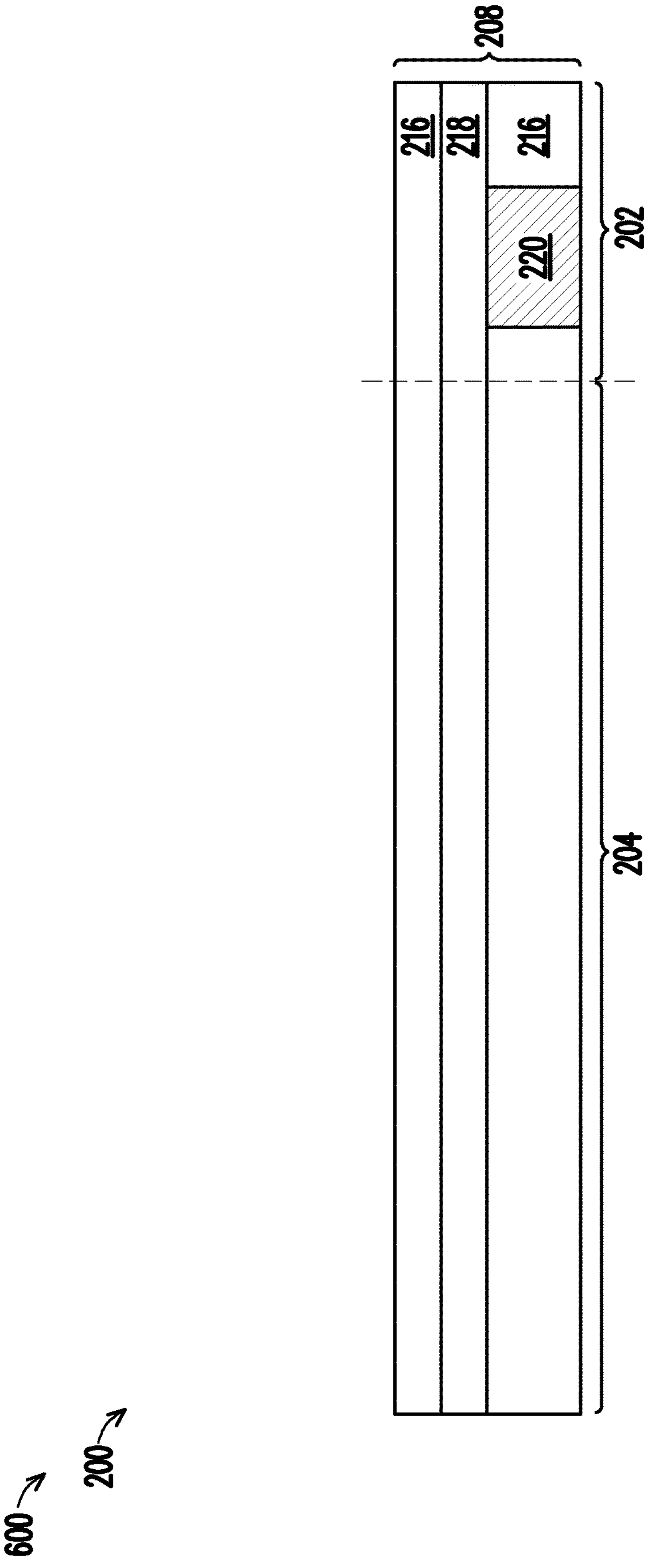
FIGS. 6A-6R are diagrams of an example implementation of forming an RF switch described herein.
Figure 6B:
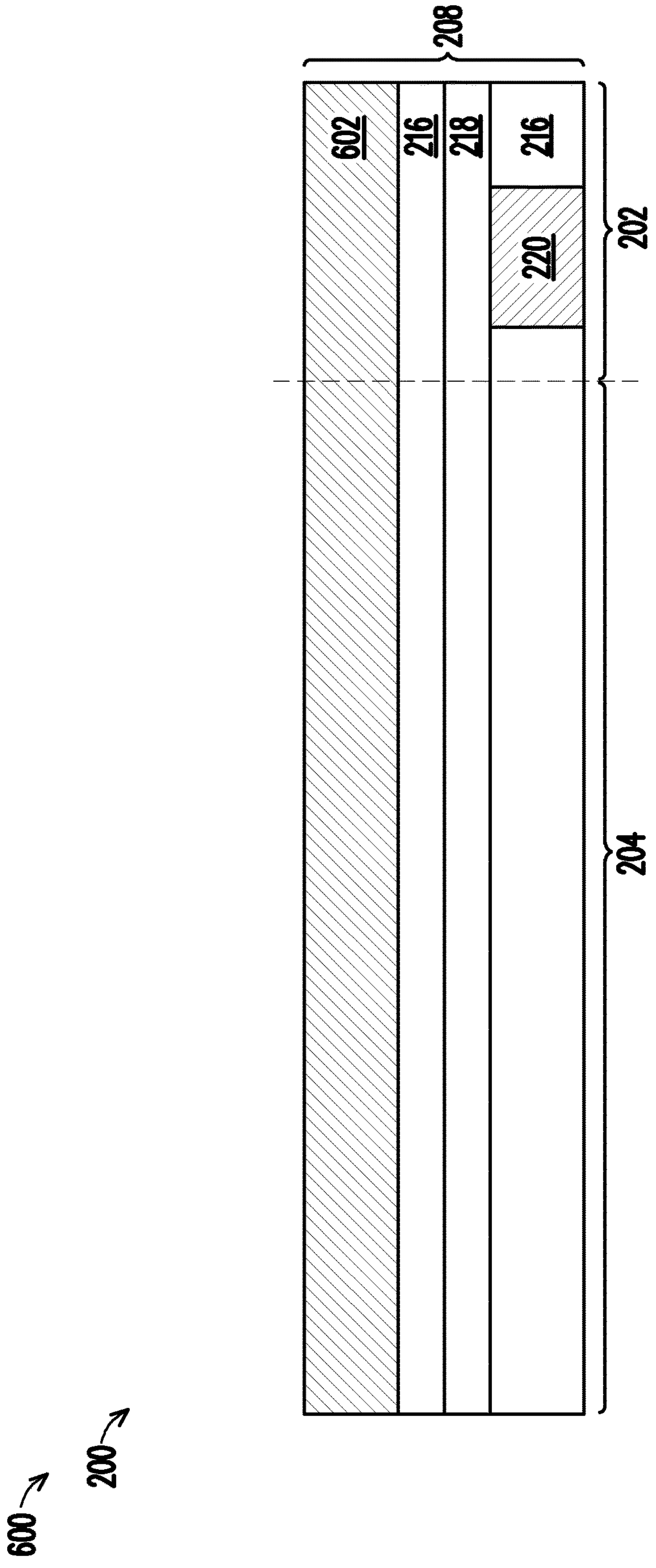
Figure 6C:
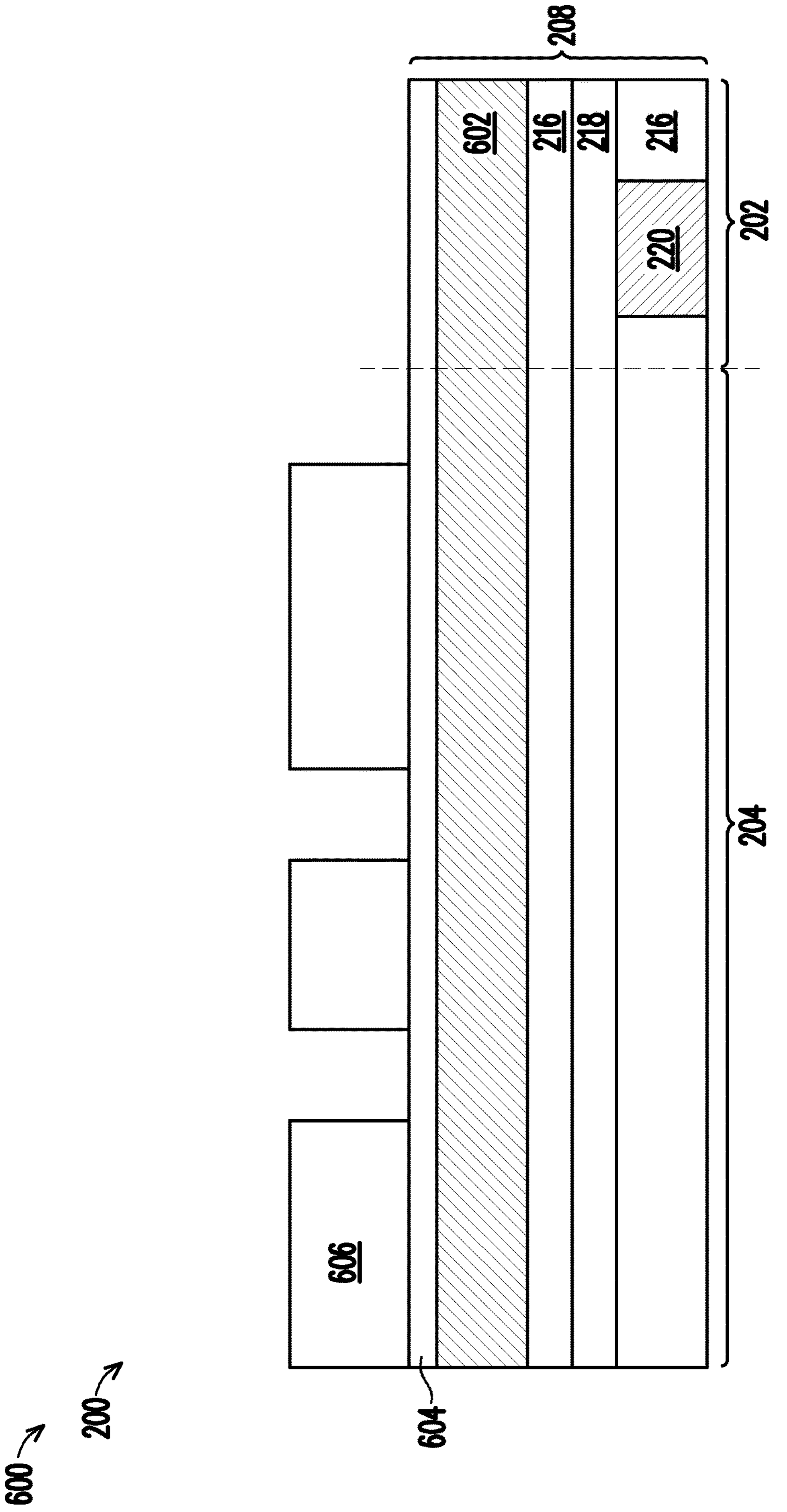
Figure 6D:
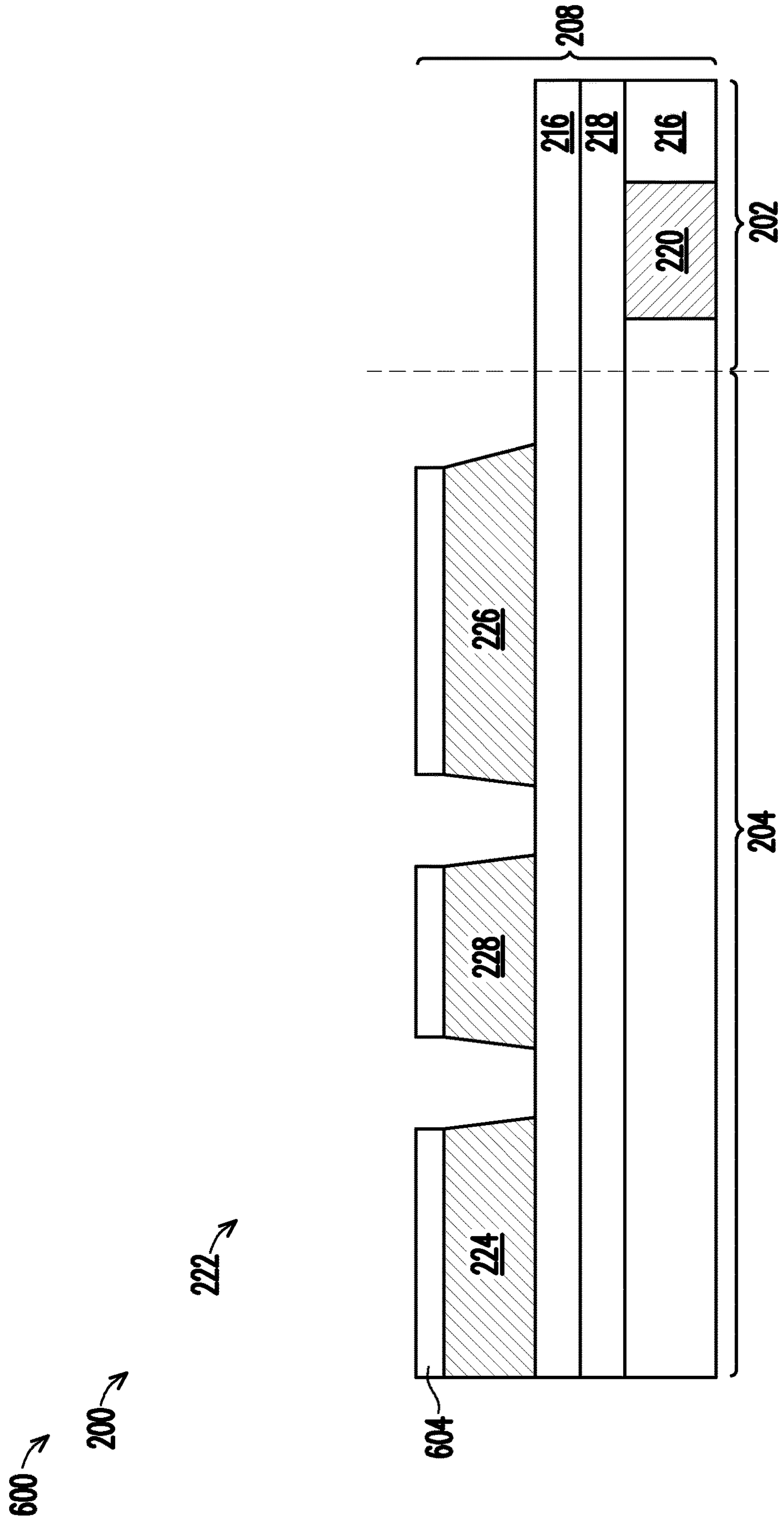
Figure 6E:
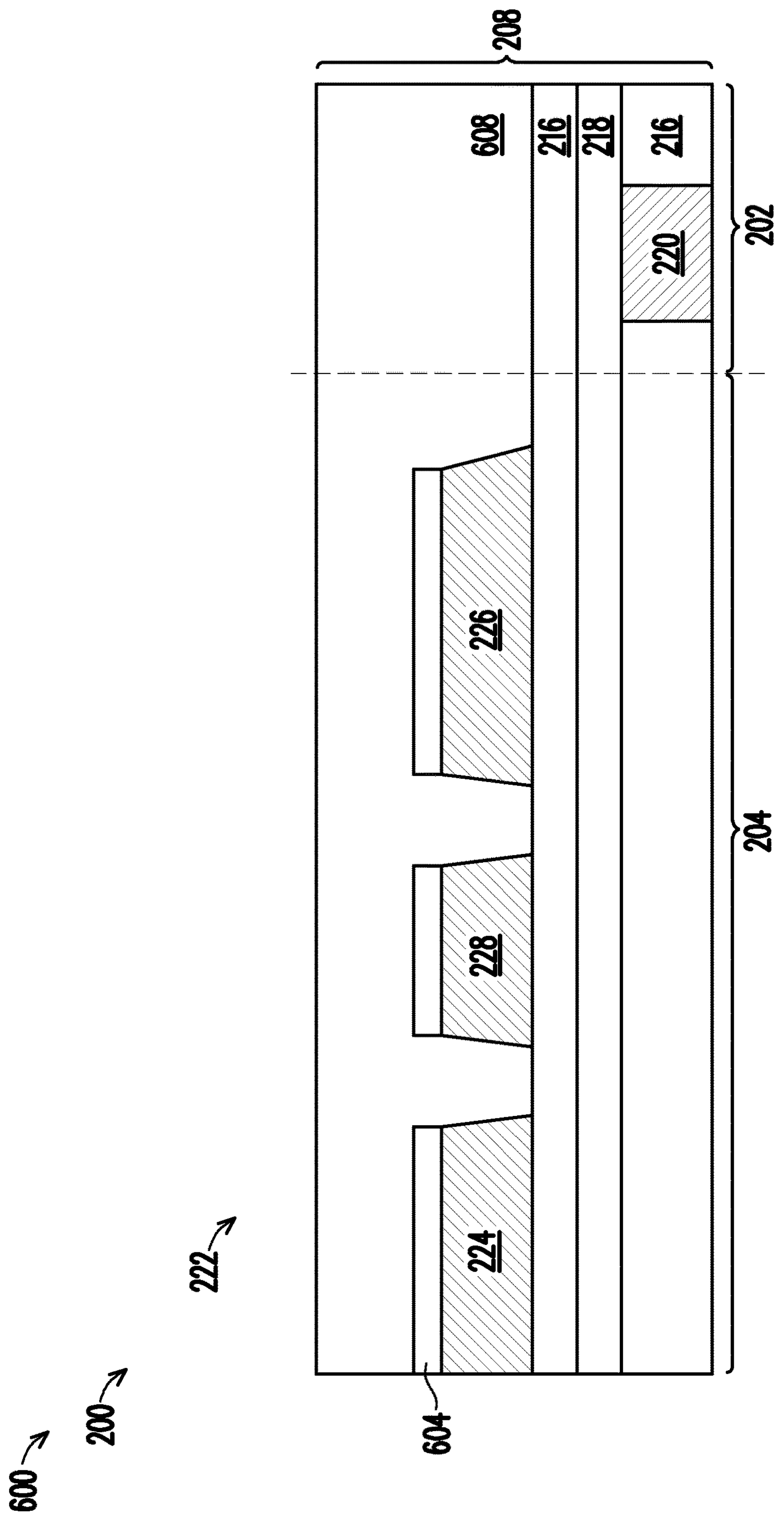
Figure 6F:
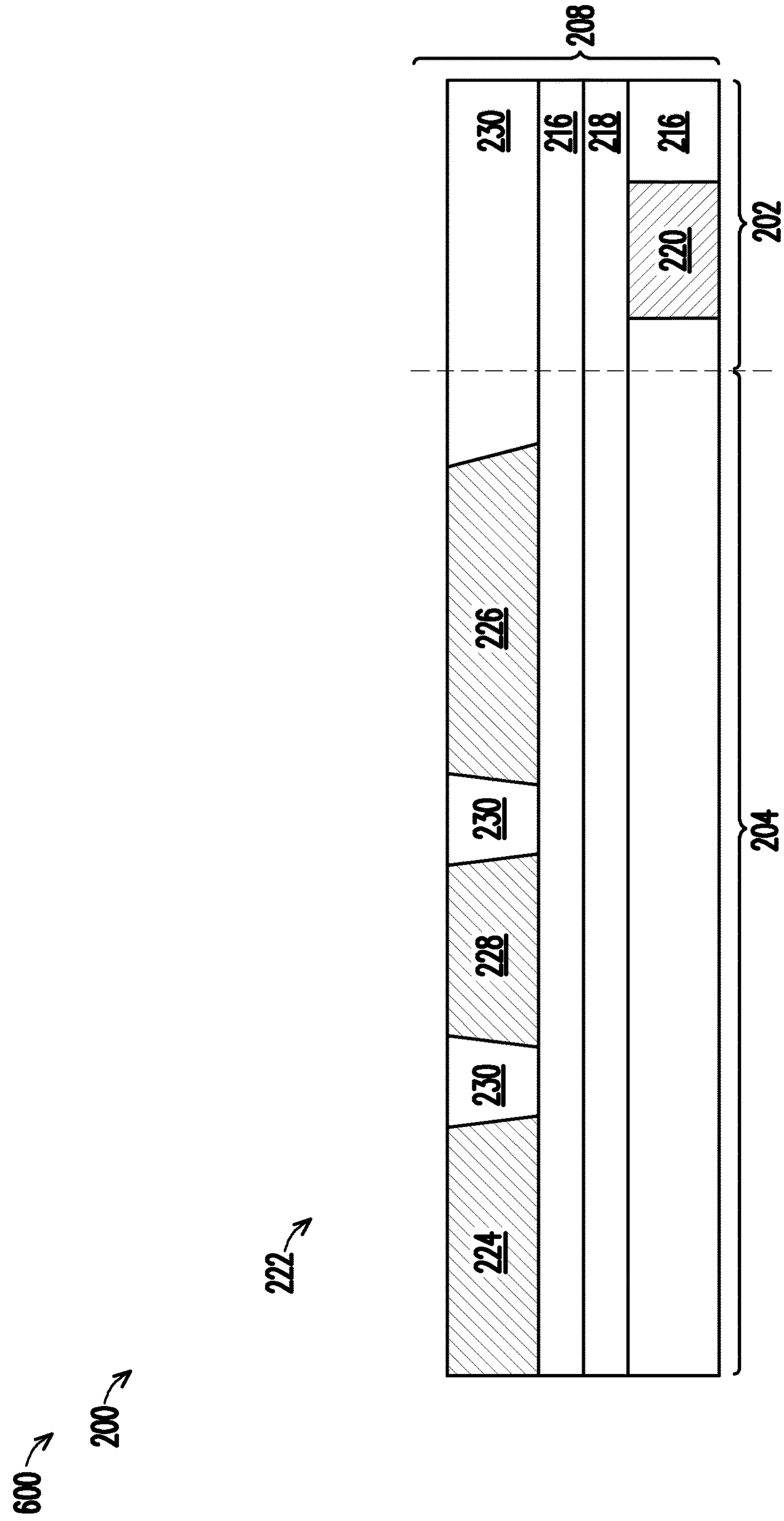
Figure 6G:
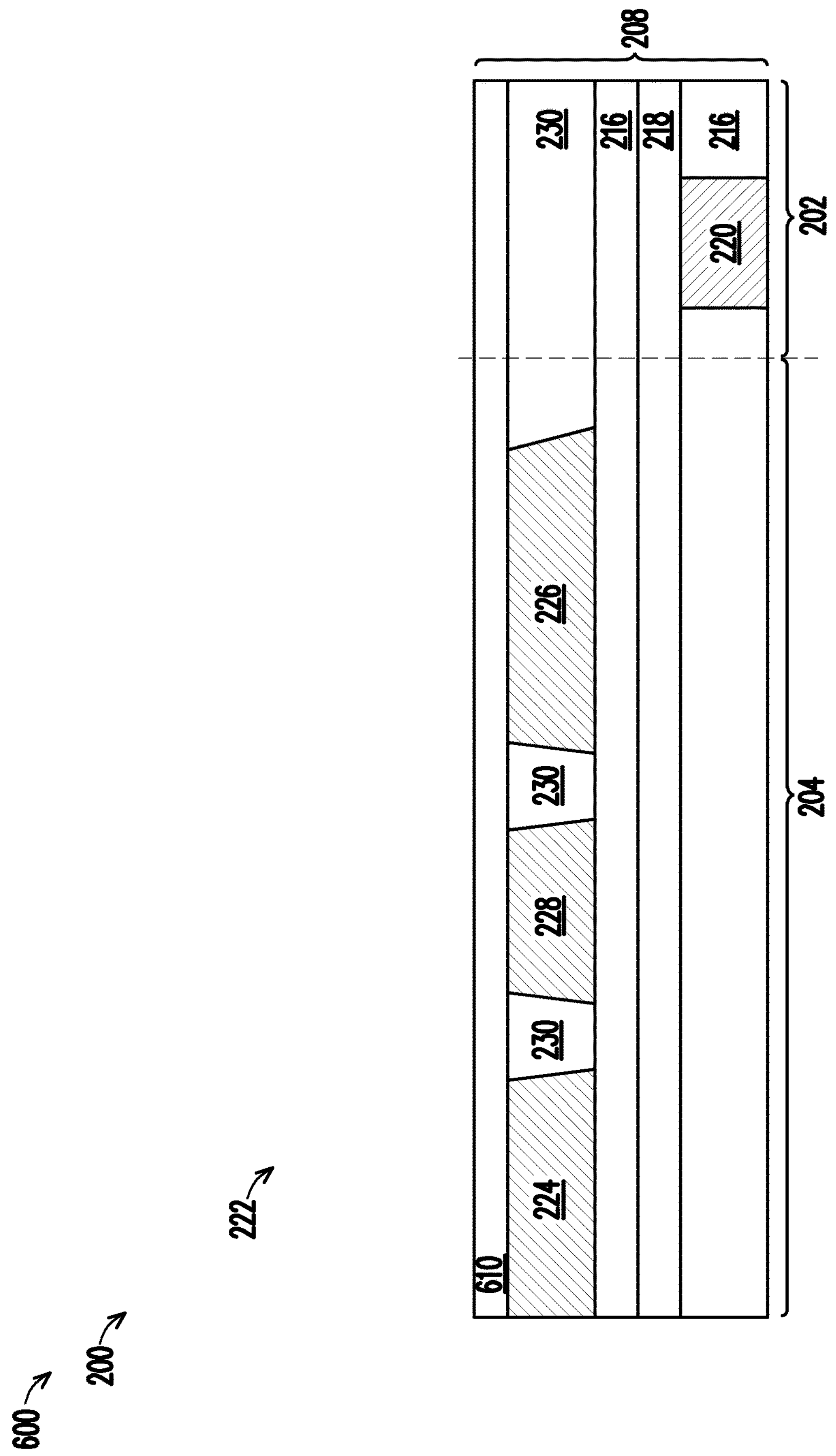
Figure 6H:
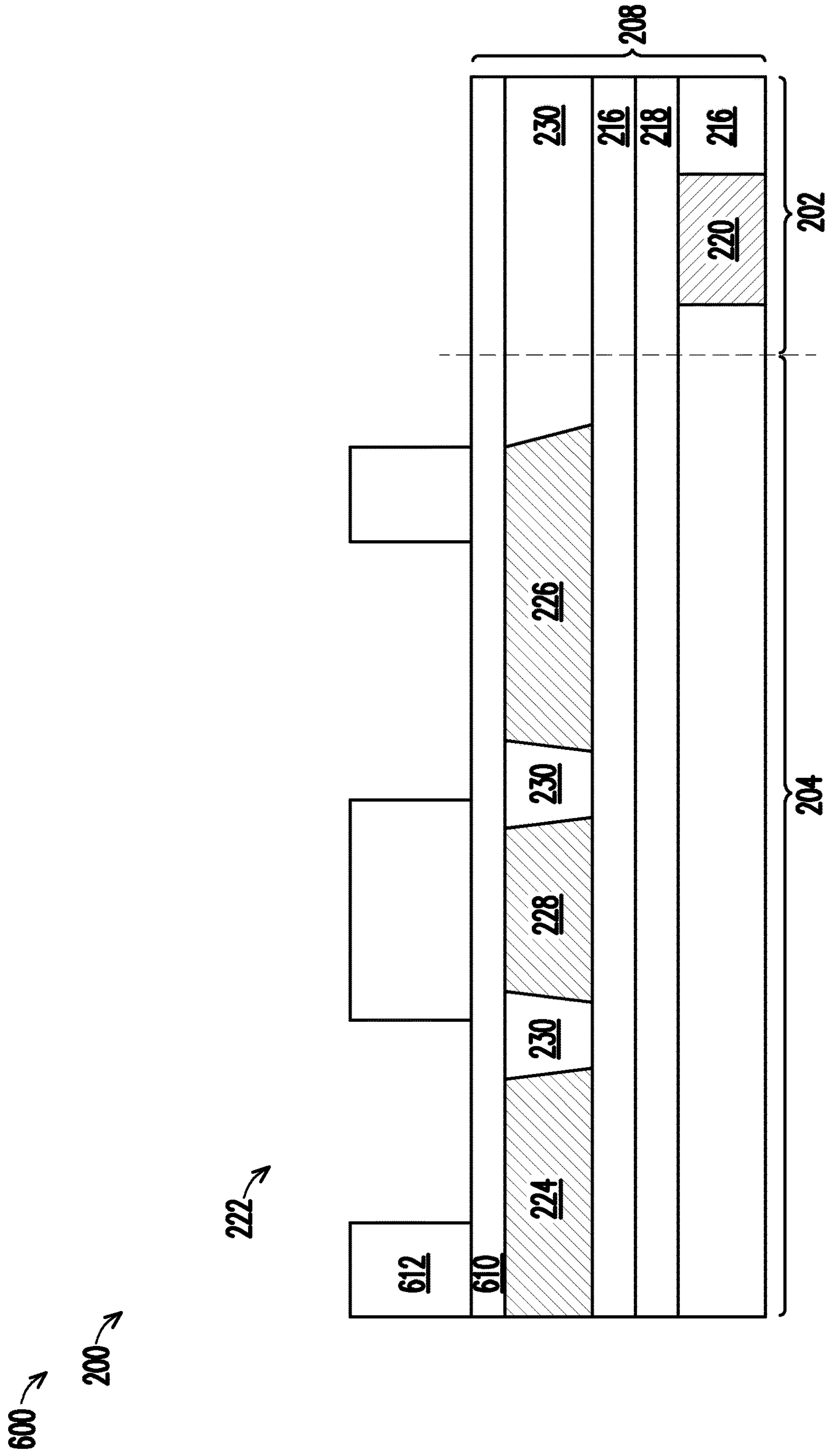
Figure 6I:
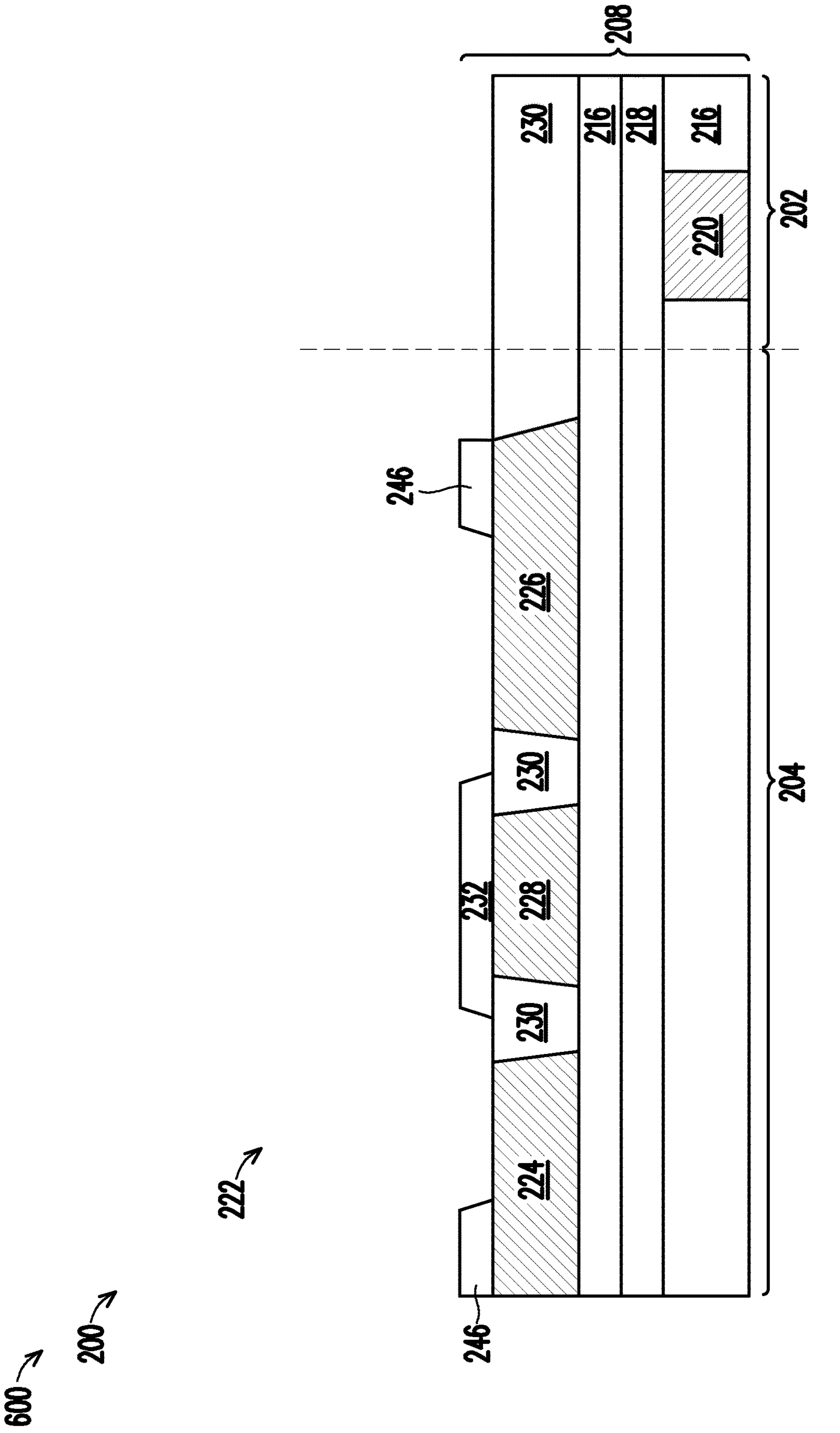
Figure 6J:
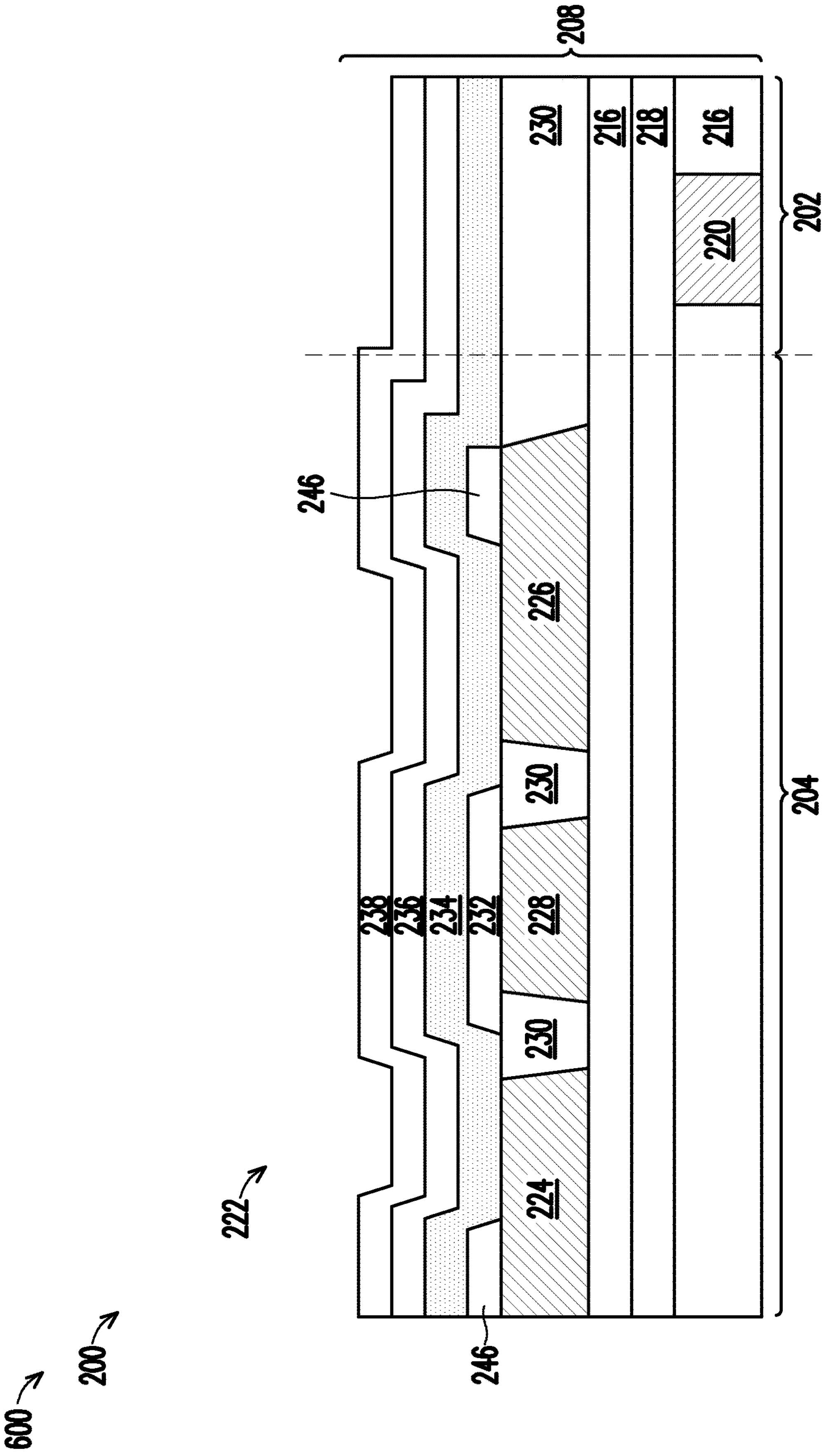
Figure 6K:
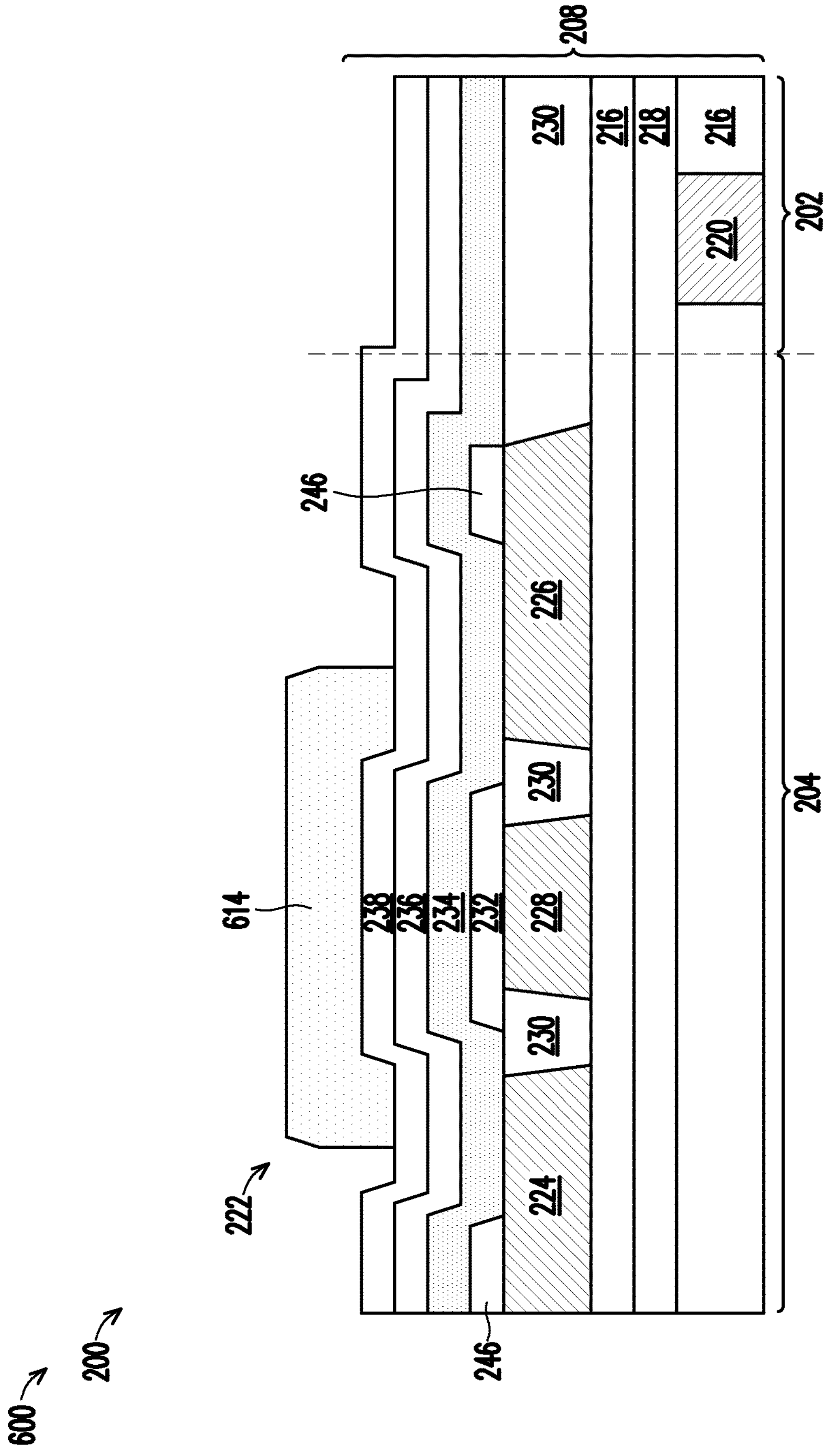
Figure 6L:
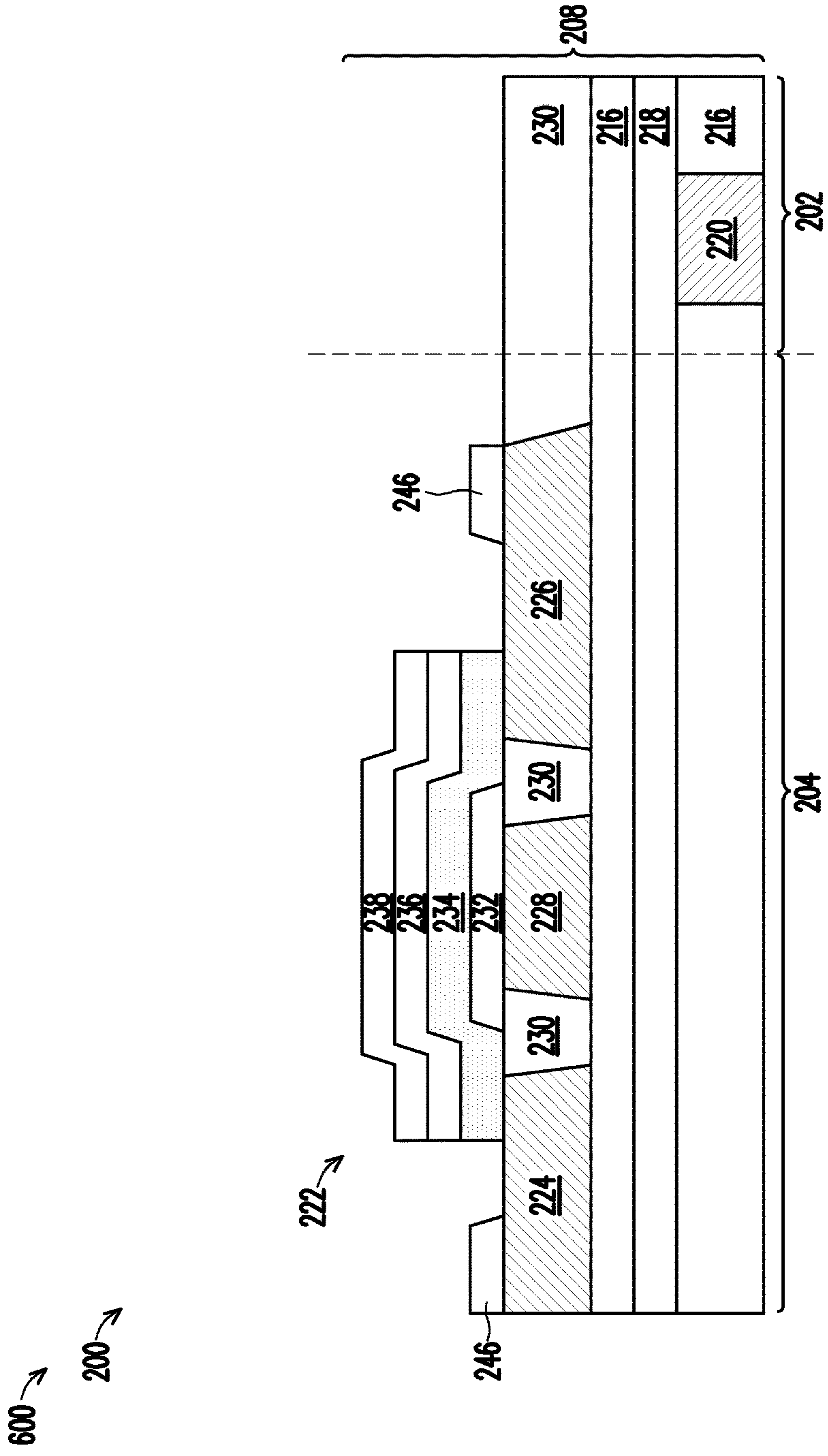
Figure 6M:
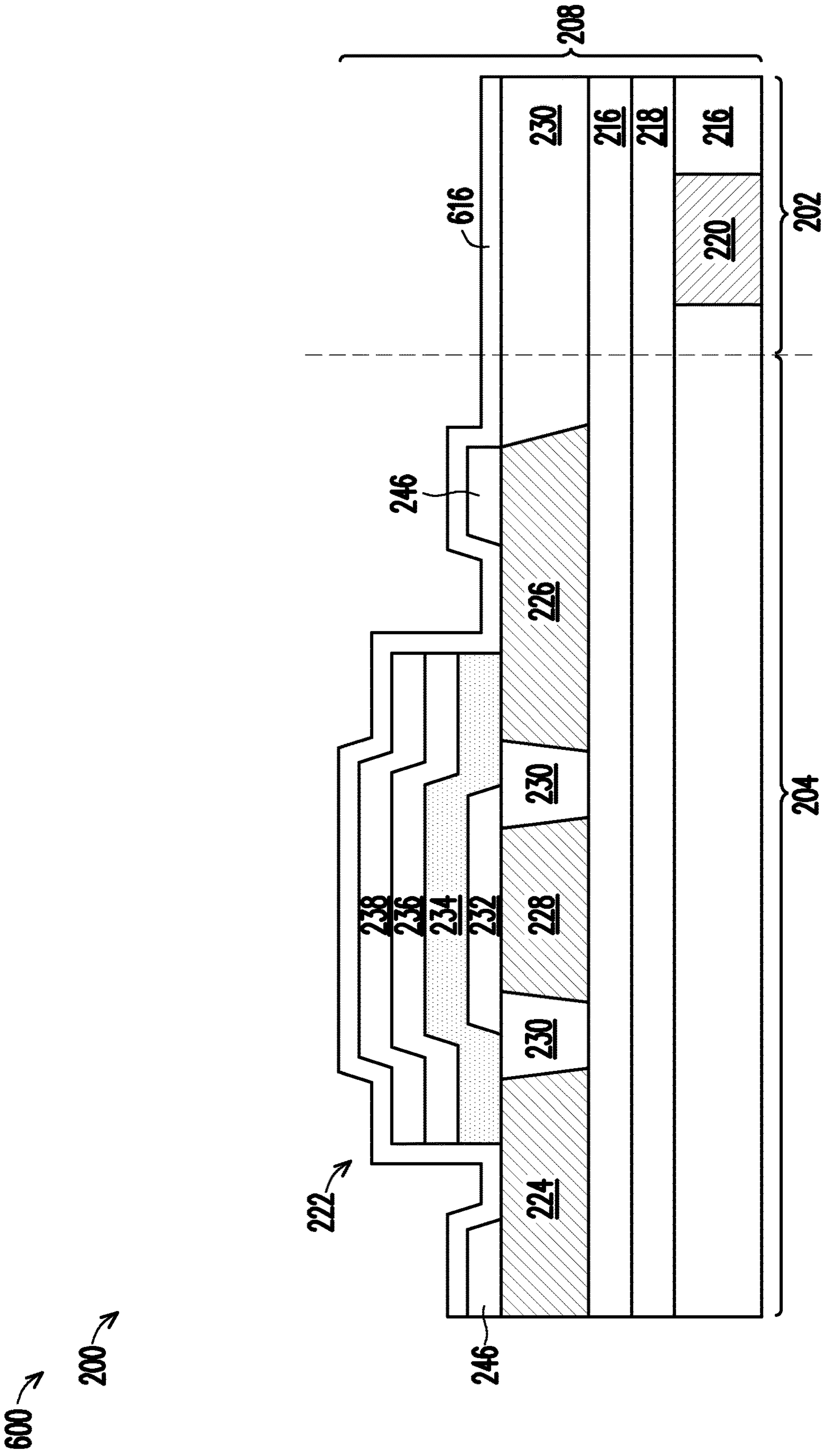
Figure 6N:
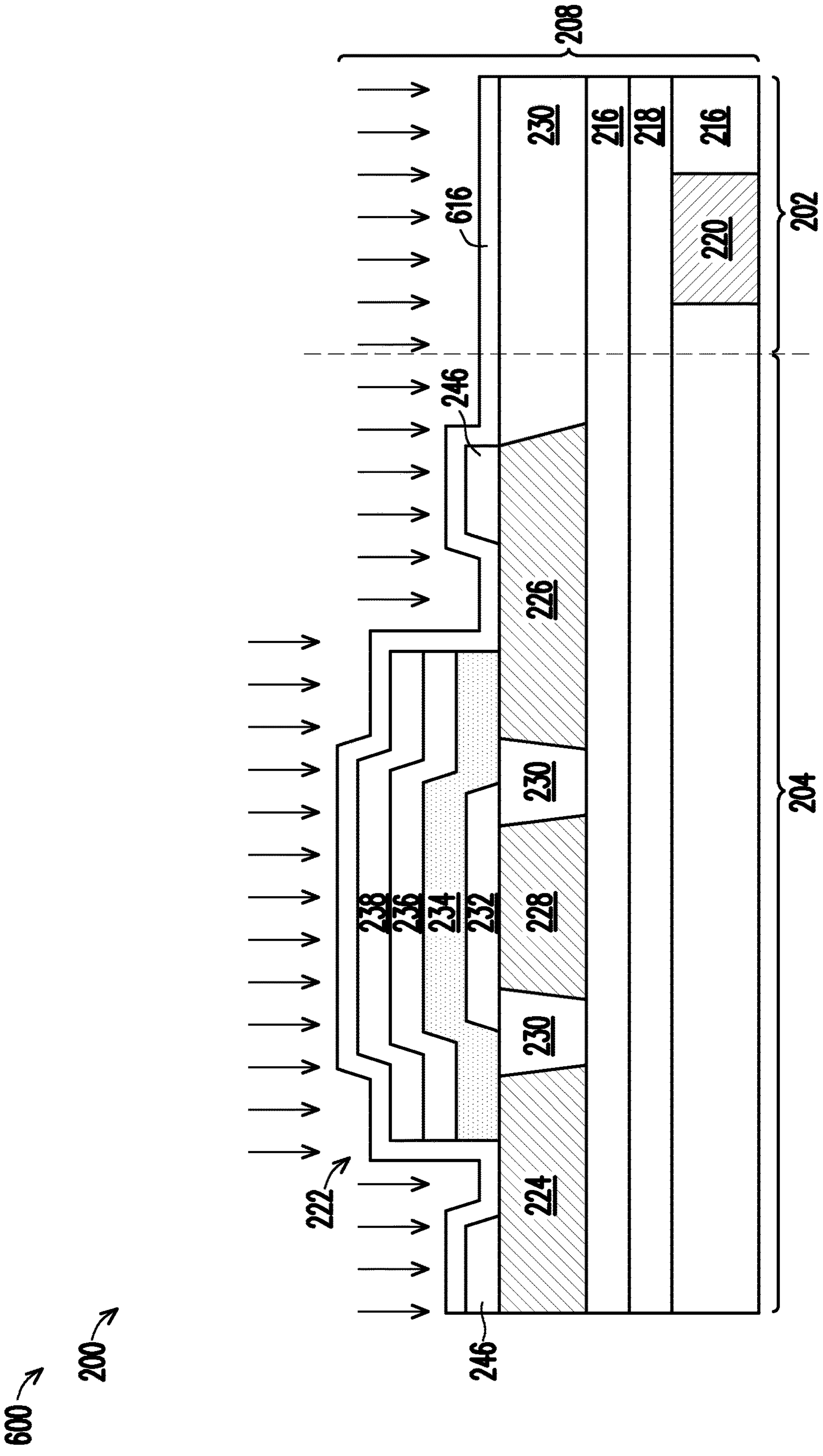
Figure 60:
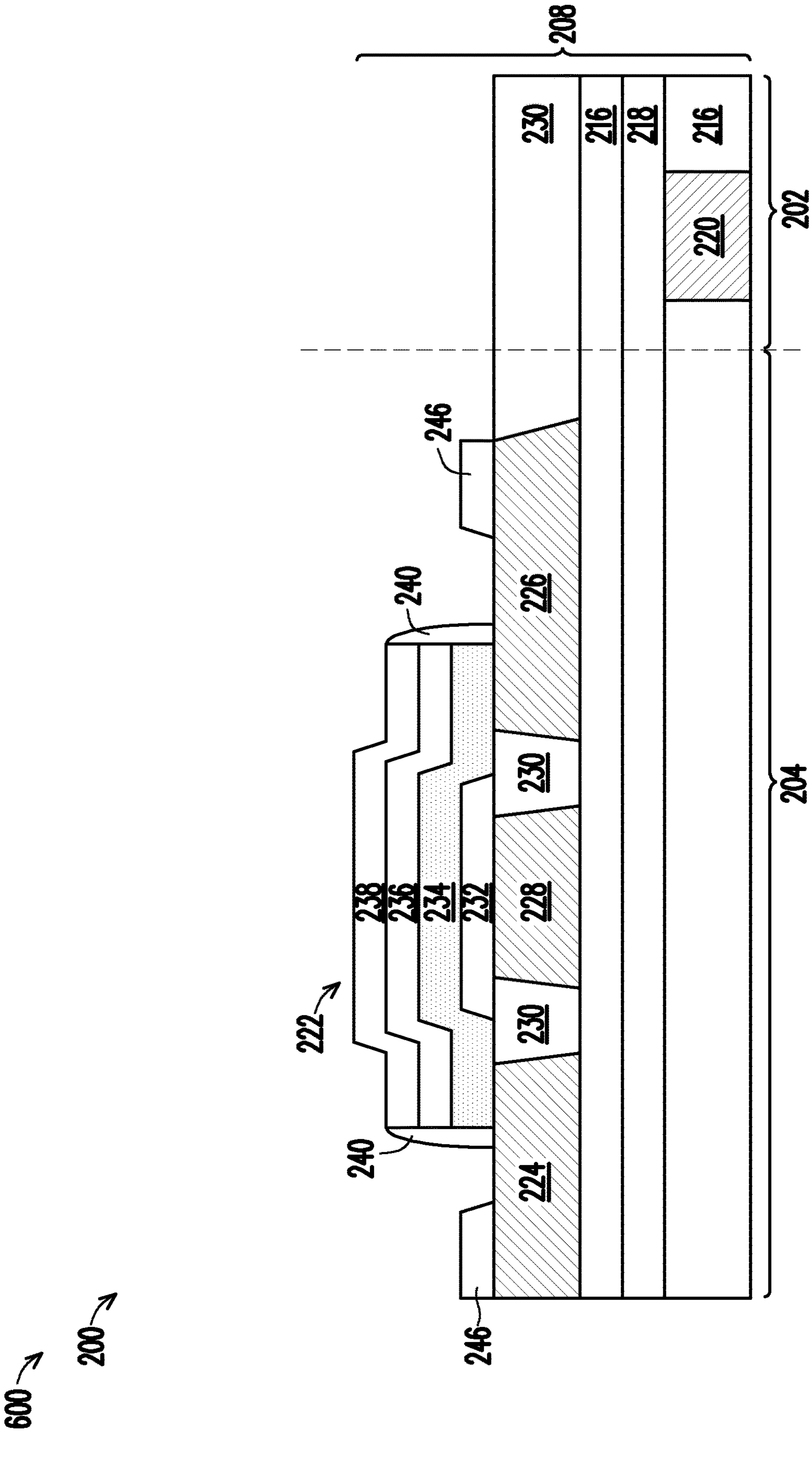
Figure 6P:
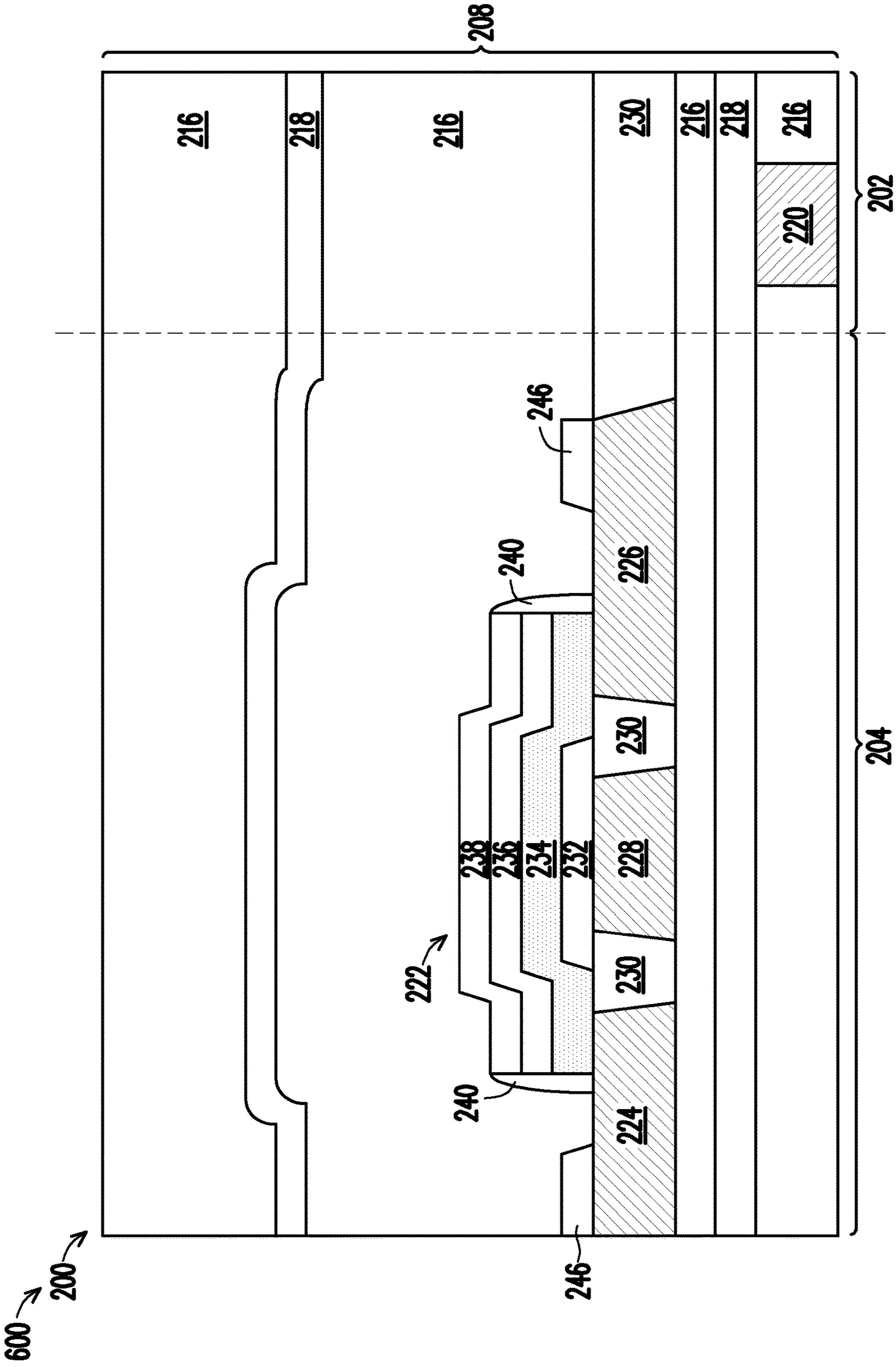
Figure 6Q:
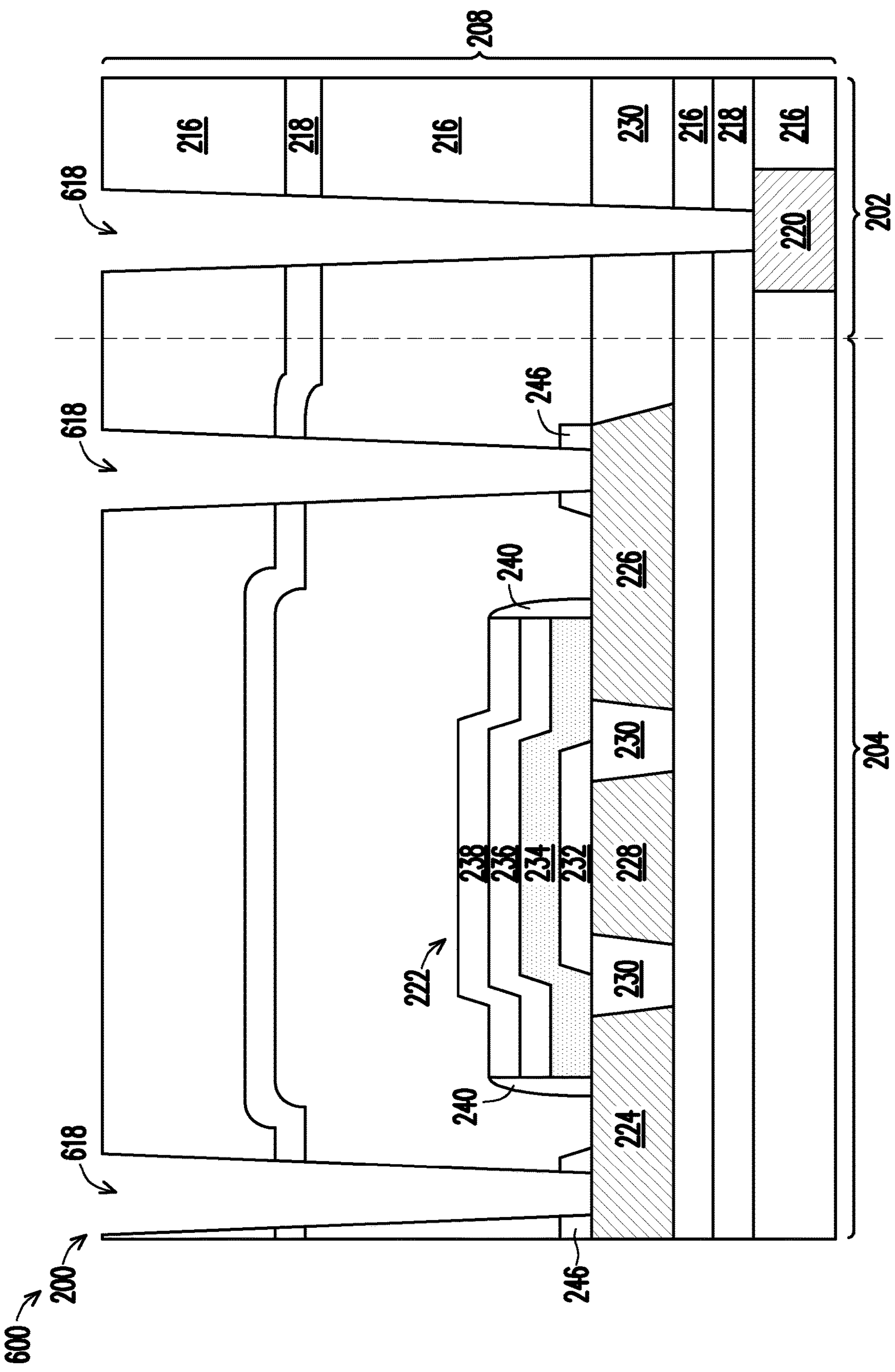
Figure 6R:
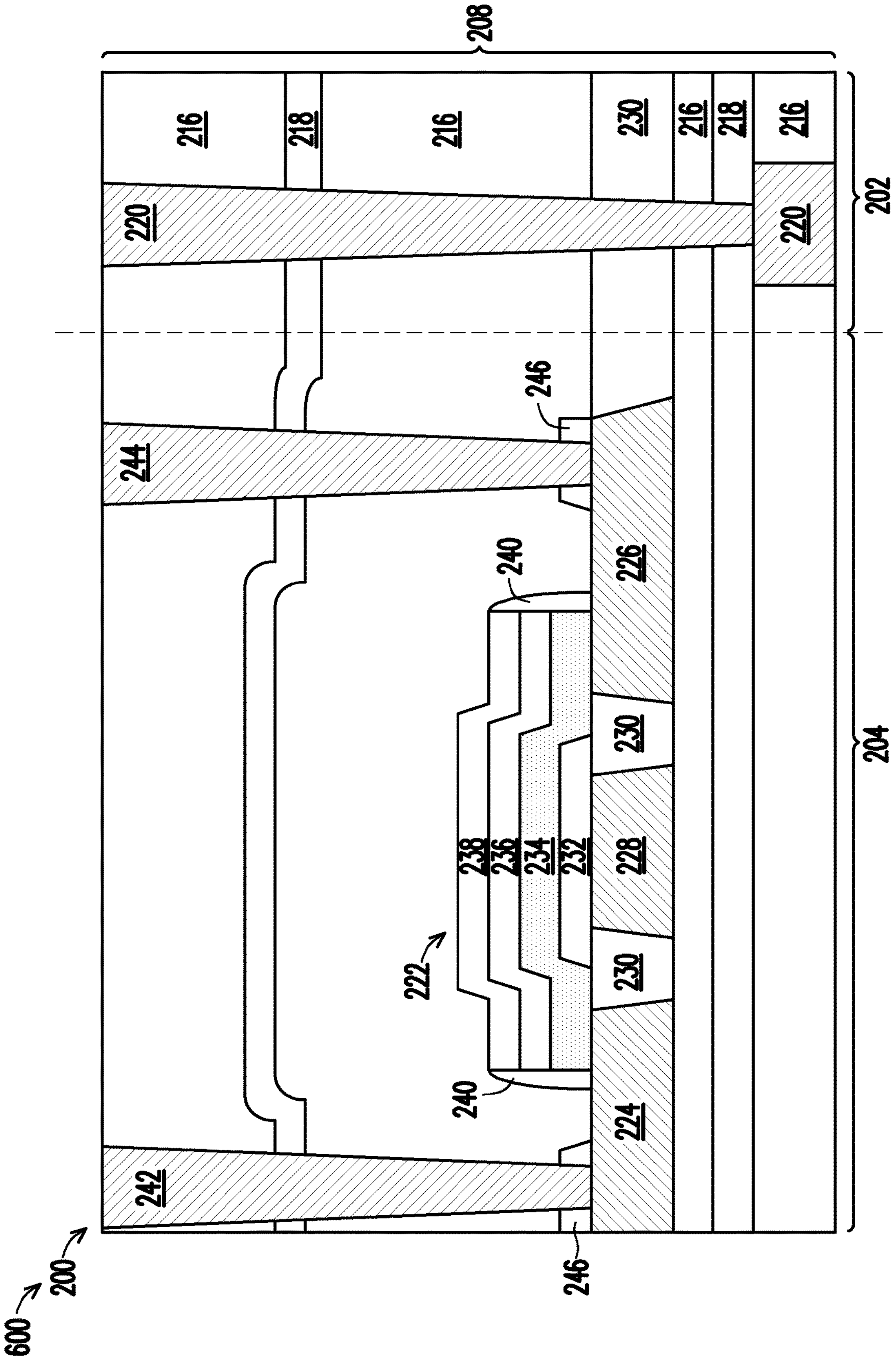

FIGS. 6A-6R are diagrams of an example implementation 600 of forming the RF switch 222 described herein described herein. The RF switch 222 is formed in the RF portion 204 of the semiconductor device 200.

In some implementations, one or more of the semiconductor processing tools 102-112 and/or the wafer/die transport tool 114 may be used to perform one or more of the semiconductor processing operations described in connection with FIGS. 6A-6R. In some implementations, one or more of the semiconductor processing operations described in connection with FIGS. 6A-6R may be performed using another semiconductor processing tool.

Turning to FIG. 6A, a dielectric layer 216 of the backend region 208 of the semiconductor device 200 may be formed, as described in connection with FIGS. 6A-6F.

As shown in FIG. 6B, a conductive layer 602 is formed in the backend region 208 of the semiconductor device 200. The conductive layer 602 may extend across the logic portion 202 and the RF portion 204 of the backend region 208. A deposition tool 102 and/or a plating tool 112 may be used to deposit the conductive layer 602 using a CVD technique, a PVD technique, an ALD technique, an electroplating technique, another deposition technique described above in connection with FIG. 1, and/or another suitable deposition technique. In some implementations, a seed layer is first deposited, and the conductive layer 602 is deposited on the seed layer. In some implementations, the planarization tool 110 may be used to planarize the conductive layer 602 after the conductive layer 602 is deposited.

As shown in FIGS. 6C and 6D, portions of the conductive layer 602 may be removed such that remaining portions of the conductive layer 602 correspond to the RF in electrode 224, the RF out electrode 226, and the heater element 228. As shown in FIG. 6C, a hard mask layer 604 and a photoresist layer 606 may be used to remove the portions of the conductive layer 602. A deposition tool 102 is used to form the hard mask layer 604 and the photoresist layer 606 on the conductive layer 602. An exposure tool 104 is used to expose the photoresist layer 606 to a radiation source to pattern the photoresist layer 606. A developer tool 106 is used to develop and remove portions of the photoresist layer 606 to expose the pattern. An etch tool 108 is used to perform an etch operation to etch into the conductive layer 602 to remove the portions of the conductive layer 602. In some implementations, the etch operation includes the use of a plasma etch technique, a wet chemical etch technique, and/or another type of etch technique.

As shown in FIG. 6D, removing the portions of the conductive layer 602 includes removing the conductive layer 602 from the logic portion 202 of the semiconductor device 200. Alternatively, some portions of the conductive layer 602 may remain in the logic portion 202 if the conductive layer 602 is also used to form other conductive structures in the logic portion 202 along with the RF in electrode 224, the RF out electrode 226, and the heater element 228 in the RF portion 204. A photoresist removal tool is used to remove the remaining portions of the photoresist layer 606 (e.g., using a chemical stripper, plasma ashing, and/or another technique) after the portions of the conductive layer 602 are removed.

As shown in FIG. 6E, a dielectric layer 608 is formed over and/or on the conductive layer 602. The dielectric layer 608 also fills in the recesses and other areas of the conductive layer 602 that were removed. The deposition tool 102 may be used to deposit the dielectric layer 608 using a PVD technique, an ALD technique, a CVD technique, an oxidation technique, another type of deposition technique described in connection with FIG. 1, and/or another suitable deposition technique.

As shown in FIG. 6F, a planarization tool 110 is used to planarize the dielectric layer 608 after the deposition tool 102 is used to deposit the dielectric layer 608. The planarization tool 110 may be used to planarize the dielectric layer 608 to remove excess material of the dielectric layer 608 on the conductive layer 602. The remaining material of the dielectric layer 608 corresponds to the dielectric fill layer 230 between the RF in electrode 224, the RF out electrode 226, and the heater element 228; and in the logic portion 202. Planarizing the dielectric layer 608 may stop on the RF in electrode 224, the RF out electrode 226, and the heater element 228 such that the top surfaces of the dielectric fill layer 230 and the RF in electrode 224, the RF out electrode 226, and the heater element 228 are co-planar.

As shown in FIG. 6G, a dielectric layer 610 is formed over and/or on the RF in electrode 224, the RF out electrode 226, the heater element 228, and the dielectric fill layer 230. A deposition tool 102 may be used to deposit the dielectric layer 610 using a PVD technique, an ALD technique, a CVD technique, another type of deposition technique described in connection with FIG. 1, and/or another suitable deposition technique. In some implementations, a planarization tool 110 is used to planarize the dielectric layer 610 after the deposition tool 102 is used to deposit the dielectric layer 610.

As shown in FIGS. 6H and 6I, portions of the dielectric layer 610 are removed such that remaining portions of the dielectric layer 610 correspond to the thermal dielectric layer 232 and the isolation layers 246. As shown in FIG. 6H, a photoresist layer 612 may be used to remove the portions of the dielectric layer 610. A deposition tool 102 is used to form the photoresist layer 612 on the dielectric layer 610. An exposure tool 104 is used to expose the photoresist layer 612 to a radiation source to pattern the photoresist layer 612. A developer tool 106 is used to develop and remove portions of the photoresist layer 612 to expose the pattern. As shown in FIG. 6H, an etch tool 108 is used to perform an etch operation to etch into the dielectric layer 610 to remove the portions of the dielectric layer 610. In some implementations, the etch operation includes the use of a plasma etch technique, a wet chemical etch technique, and/or another type of etch technique. A photoresist removal tool is used to remove the remaining portions of the photoresist layer 612 (e.g., using a chemical stripper, plasma ashing, and/or another technique) after the portions of the dielectric layer 610 are removed.

As further shown in FIG. 6J, the layer stack of the RF switch 222 is formed over the semiconductor device 200. The layer stack is formed in the RF portion 204 and in the logic portion 202. Forming the layer stack includes forming the PCM layer 234 over and/or on the RF in electrode 224, over and/or on the RF out electrode 226, over and/or on the dielectric fill layer 230, over and/or on the thermal dielectric layer 232, and/or over and/or on the isolation layers 246, among other examples. Forming the layer stack further includes forming the nitride capping layer 236 on the PCM layer 234. Forming the layer stack may further include forming the oxide capping layer 238 on the nitride capping layer 236. A deposition tool 102 may be used to deposit the PCM layer 234, the nitride capping layer 236, and/or the oxide capping layer 238 using a PVD technique, an ALD technique, a CVD technique, another type of deposition technique described in connection with FIG. 1, and/or another suitable deposition technique.

As shown in FIGS. 6K and 6L, portions of the layer stack are removed (e.g., from the logic portion 202, from the RF portion 204) such that the layer stack of the RF switch 222 is defined. As shown in FIG. 6H, a photoresist layer 614 may be used to remove the portions of PCM layer 234, portions of the nitride capping layer 236, and portions of the oxide capping layer 238. A deposition tool 102 is used to form the photoresist layer 614 on the oxide capping layer 238. An exposure tool 104 is used to expose the photoresist layer 614 to a radiation source to pattern the photoresist layer 614. A developer tool 106 is used to develop and remove portions of the photoresist layer 614 to expose the pattern. As shown in FIG. 6L, an etch tool 108 is used to perform an etch operation to etch through the PCM layer 234, the nitride capping layer 236, and the oxide capping layer 238 to remove the portions of PCM layer 234, portions of the nitride capping layer 236, and portions of the oxide capping layer 238. In some implementations, the etch operation includes the use of a plasma etch technique, a wet chemical etch technique, and/or another type of etch technique. A photoresist removal tool is used to remove the remaining portions of the photoresist layer 614 (e.g., using a chemical stripper, plasma ashing, and/or another technique).

As shown in FIGS. 6M-6O, the sidewall spacers 240 are formed on the sidewalls of the layer stack of the RF switch 222. In particular, the sidewall spacers 240 are formed on the sidewalls of the PCM layer 234, and on other layers of the layer stack including the nitride capping layer 236 and the oxide capping layer 238. The sidewall spacers 240 are formed in a manner such that the additional material does not remain in the logic portion 202 as a result of the formation of the sidewall spacers 240.

As shown in FIG. 6M, a deposition tool 102 is used to deposit a dielectric layer 616 using a PVD technique, an ALD technique, a CVD technique, another type of deposition technique described in connection with FIG. 1, and/or another suitable deposition technique. The dielectric layer 616 may be deposited by blanket deposition such that the dielectric layer 616 covers logic portion 202 and the RF portion 204 including the RF switch 222.

As shown in FIGS. 6N and 6O, portions of the dielectric layer 616 are removed, and remaining portions of the dielectric layer 616 correspond to the sidewall spacers 240. A highly directional etch is performed to remove the portions of the dielectric layer 616 to form the sidewall spacers 240. The highly directional etch may be a vertical etch, or an etch that occurs in a direction that is approximately perpendicular to the substrate 210 and approximately parallel with the sidewalls of the layer stack of the RF switch 222.

The highly directional etch may be referred to as a self-aligned etch operation in that the portions of the dielectric layer 616 are removed without the use of additional patterned masking layers (e.g., without first depositing additional hard mask layers and/or additional photoresist layers). The highly directional etch enables the dielectric layer 616 to be removed from the logic portion 202 of the semiconductor device 200 while enabling the remaining portions of the dielectric layer 616 to remain on the sidewalls of the layer stack of the RF switch 222 as the sidewall spacers 240.

The highly directional etch may be implemented using an anisotropic etch technique such as a dry etch technique. The dry etch technique may include using a plasma-based dry etch technique in a self-aligned dry etch operation in which a plasma (e.g., a nitrogen-based plasma and/or another type of plasma) is used to control the directionality of ion bombardment onto the dielectric layer 616. The self-aligned dry etch operation may be performed using an inductively coupled plasma (ICP) etch tool 108 and/or another type of plasma-based etch tool 108.

One or more types of gasses (e.g., reactant gasses, carrier gasses) may be used in the self-aligned dry etch operation, such as a difluoromethane ($CH_2F_2$) gas, an oxygen ($O_2$) gas, an argon (Ar) gas, and/or a helium (He) gas, among other examples. The flow rate of the difluoromethane gas in the self-aligned dry etch operation may be included in a range of approximately 35 standard cubic centimeters per minute (sccm) to approximately 45 sccm. However, other values for the range are within the scope of the present disclosure. The flow rate of the oxygen gas in the self-aligned dry etch operation may be included in a range of approximately 10 sccm to approximately 30 sccm. However, other values for the range are within the scope of the present disclosure. The flow rate of the argon gas in the self-aligned dry etch operation may be included in a range of approximately 80 sccm to approximately 120 sccm. However, other values for the range are within the scope of the present disclosure. The flow rate of the helium gas in the self-aligned dry etch operation may be included in a range of approximately 30 sccm to approximately 70 sccm. However, other values for the range are within the scope of the present disclosure.

In some implementations, a process time of the self-aligned dry etch operation may be included in a range of approximately 20 seconds to fully remove the portions of the dielectric layer 616 while minimizing over-etching in the semiconductor device 200. However, other values for the range are within the scope of the present disclosure. In some implementations, a pressure in the processing chamber of the etch tool 108 for the self-aligned dry etch operation may be included in a range of approximately 5 millitorr (mT) to approximately 15 mT to achieve a high directionality for the self-aligned dry etch operation. However, other values for the range are within the scope of the present disclosure. In some implementations, a temperature in the processing chamber of the etch tool 108 for the self-aligned dry etch operation may be included in a range of approximately 55 degrees Celsius to approximately 65 degrees Celsius. However, other values for the range are within the scope of the present disclosure. In some implementations, a plasma power in the self-aligned dry etch operation may be included in a range of approximately 325 watts to approximately 425 watts. However, other values for the range are within the scope of the present disclosure. In some implementations, a bias voltage for the plasma in the self-aligned dry etch operation may be included in a range of approximately 80 volts to approximately 150 volts to achieve a high directionality for the self-aligned dry etch operation. However, other values for the range are within the scope of the present disclosure.

As shown in FIG. 6P, one or more additional layers of the backend region 208 are formed over and/or on the RF switch 222. For example, a dielectric layer 216 may be formed in the backend region 208, an ESL 218 may be formed on the dielectric layer 216, another dielectric layer 216 may be formed on the ESL 218, and so on. The oxide capping layer 238 of the RF switch 222 may be in direct contact with a dielectric layer 216 (e.g., an oxide dielectric layer) as a result of formation of the sidewall spacers 240. In particular, the oxide capping layer 238 of the RF switch 222 may be in direct contact with a dielectric layer 216 because of the dielectric layer 616 (e.g., a nitride recapping layer) being removed from the top surface of the oxide capping layer 238 during formation of the sidewall spacers 240. A deposition tool 102 may be used to deposit the one or more additional layers of the backend region 208 using a PVD technique, an ALD technique, a CVD technique, an oxidation technique, another type of deposition technique described in connection with FIG. 1, and/or another suitable deposition technique.

As shown in FIG. 6Q, recesses 618 may be formed in and/or through the backend region 208 in the RF portion 204 and in the logic portion 202. A recess 618 may be formed to the RF in electrode 224, a recess 618 may be formed to the RF out electrode 226, and one or more recesses 618 may be formed in the logic portion 202 to one or more metallization layers 220 in the logic portion 202. The removal of the dielectric layer 616 during formation of the sidewall spacers 240 of the RF switch 222 increases the likelihood that the recess(s) 618 in the logic portion 202 will be fully formed to the underlying metallization layers 220.

As shown in FIG. 6R, the recesses 618 may be filled with one or more conductive materials to form the RF in interconnect 242, the RF out interconnect 244, and the one or more metallization layers 220 in the logic portion 202. A deposition tool 102 and/or a plating tool 112 may be used to deposit the RF in interconnect 242, the RF out interconnect 244, and the one or more metallization layers 220 using a CVD technique, a PVD technique, an ALD technique, an electroplating technique, another deposition technique described above in connection with FIG. 1, and/or another suitable deposition technique. In some implementations, a seed layer is first deposited, and the RF in interconnect 242, the RF out interconnect 244, and/or the one or more metallization layers 220 are deposited on the seed layer. In some implementations, the planarization tool 110 may be used to planarize the RF in interconnect 242, the RF out interconnect 244, and/or the one or more metallization layers 220 after the RF in interconnect 242, the RF out interconnect 244, and/or the one or more metallization layers 220 are deposited.

As indicated above, FIGS. 6A-6R are provided as an example. Other examples may differ from what is described with regard to FIGS. 6A-6R.

Figure 7:
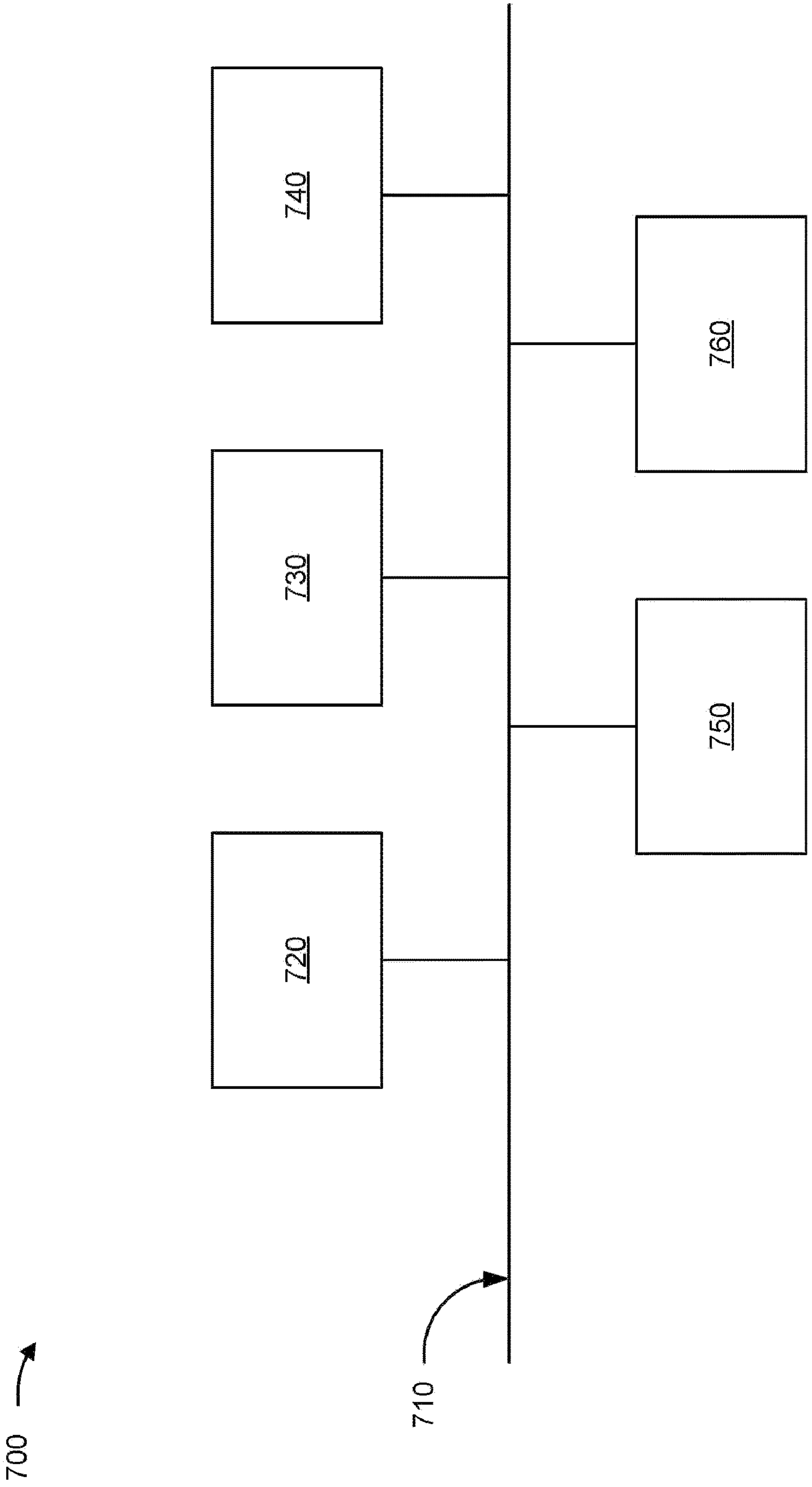
FIG. 7 is a diagram of example components of a device described herein.

FIG. 7 is a diagram of example components of a device 700 described herein. In some implementations, one or more of the semiconductor processing tools 102-112 and/or the wafer/die transport tool 114 may include one or more devices 700 and/or one or more components of the device 700. As shown in FIG. 7, the device 700 may include a bus 710, a processor 720, a memory 730, an input component 740, an output component 750, and/or a communication component 760.

The bus 710 may include one or more components that enable wired and/or wireless communication among the components of the device 700. The bus 710 may couple together two or more components of FIG. 7, such as via operative coupling, communicative coupling, electronic coupling, and/or electric coupling. For example, the bus 710 may include an electrical connection (e.g., a wire, a trace, and/or a lead) and/or a wireless bus. The processor 720 may include a central processing unit, a graphics processing unit, a microprocessor, a controller, a microcontroller, a digital signal processor, a field-programmable gate array, an application-specific integrated circuit, and/or another type of processing component. The processor 720 may be implemented in hardware, firmware, or a combination of hardware and software. In some implementations, the processor 720 may include one or more processors capable of being programmed to perform one or more operations or processes described elsewhere herein.

The memory 730 may include volatile and/or nonvolatile memory. For example, the memory 730 may include random access memory (RAM), read only memory (ROM), a hard disk drive, and/or another type of memory (e.g., a flash memory, a magnetic memory, and/or an optical memory). The memory 730 may include internal memory (e.g., RAM, ROM, or a hard disk drive) and/or removable memory (e.g., removable via a universal serial bus connection). The memory 730 may be a non-transitory computer-readable medium. The memory 730 may store information, one or more instructions, and/or software (e.g., one or more software applications) related to the operation of the device 700. In some implementations, the memory 730 may include one or more memories that are coupled (e.g., communicatively coupled) to one or more processors (e.g., processor 720), such as via the bus 710. Communicative coupling between a processor 720 and a memory 730 may enable the processor 720 to read and/or process information stored in the memory 730 and/or to store information in the memory 730.

The input component 740 may enable the device 700 to receive input, such as user input and/or sensed input. For example, the input component 740 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 750 may enable the device 700 to provide output, such as via a display, a speaker, and/or a light-emitting diode. The communication component 760 may enable the device 700 to communicate with other devices via a wired connection and/or a wireless connection. For example, the communication component 760 may include a receiver, a transmitter, a transceiver, a modem, a network interface card, and/or an antenna.

The device 700 may perform one or more operations or processes described herein. For example, a non-transitory computer-readable medium (e.g., memory 730) may store a set of instructions (e.g., one or more instructions or code) for execution by the processor 720. The processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry may be used instead of or in combination with the instructions to perform one or more operations or processes described herein. Additionally, or alternatively, the processor 720 may be configured to perform one or more operations or processes described herein. Thus, implementations described herein are not limited to any specific combination of hardware circuitry and software.

The number and arrangement of components shown in FIG. 7 are provided as an example. The device 700 may include additional components, fewer components, different components, or differently arranged components than those shown in FIG. 7. Additionally, or alternatively, a set of components (e.g., one or more components) of the device 700 may perform one or more functions described as being performed by another set of components of the device 700.

Figure 8:
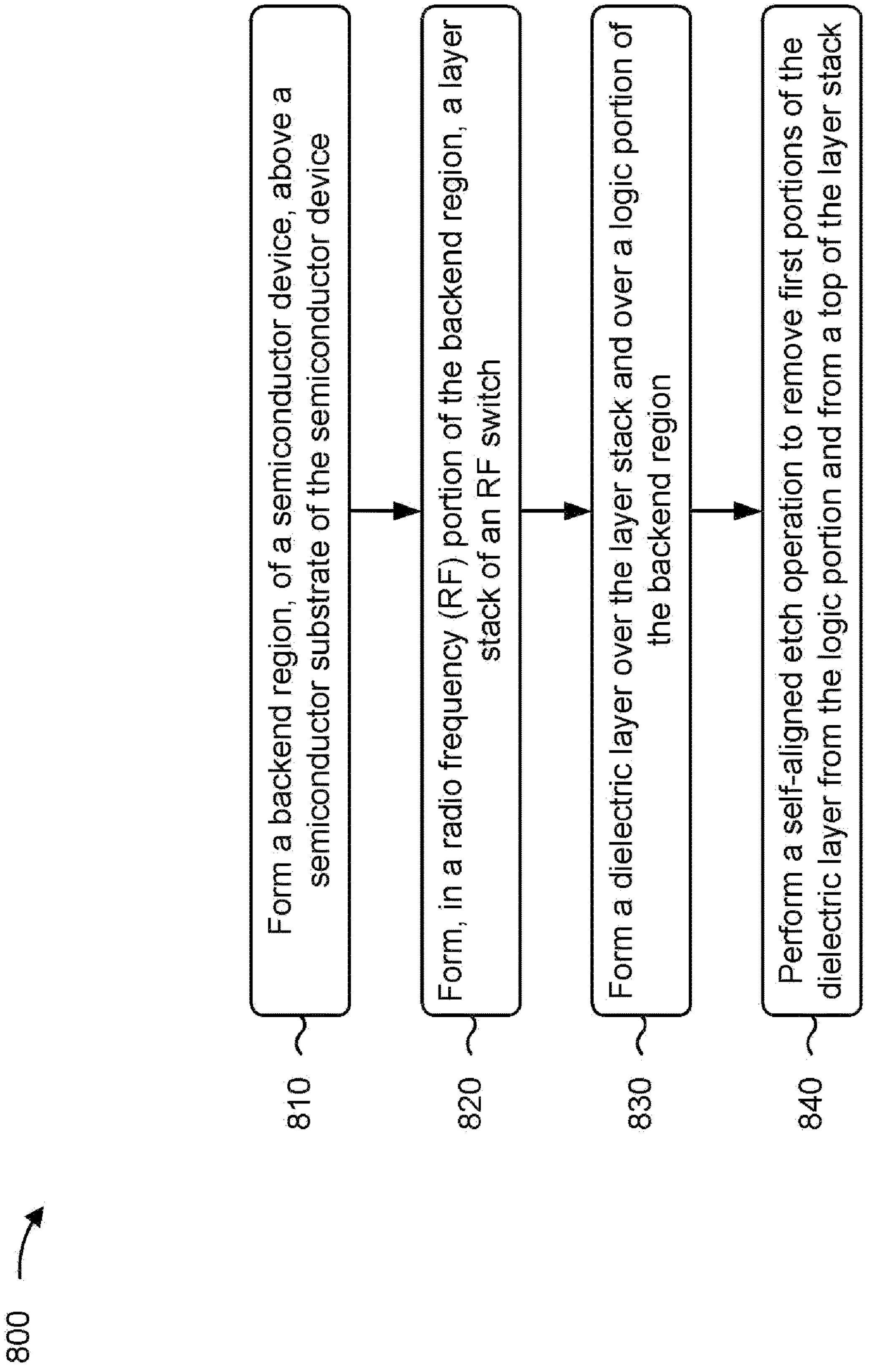
FIG. 8 is a flowchart of an example process associated with forming a semiconductor device described herein.

FIG. 8 is a flowchart of an example process 800 associated with forming a semiconductor device described herein. In some implementations, one or more process blocks of FIG. 8 are performed using one or more semiconductor processing tools (e.g., one or more of the semiconductor processing tools 102-112). Additionally, or alternatively, one or more process blocks of FIG. 8 may be performed using one or more components of device 700, such as processor 720, memory 730, input component 740, output component 750, and/or communication component 760.

As shown in FIG. 8, process 800 may include forming a backend region, of a semiconductor device, above a semiconductor substrate of the semiconductor device (block 810). For example, one or more of the semiconductor processing tools 102-112 may be used to form a backend region 208, of a semiconductor device 200, above a semiconductor substrate (e.g., the substrate 210) of the semiconductor device 200, as described herein.

As further shown in FIG. 8, process 800 may include forming, in an RF portion of the backend region, a layer stack of an RF switch (block 820). For example, one or more of the semiconductor processing tools 102-112 may be used to form, in an RF portion 204 of the backend region 208, a layer stack (e.g., layers 232-238) of an RF switch 222, as described herein.

As further shown in FIG. 8, process 800 may include forming a dielectric layer over the layer stack and over a logic portion of the backend region (block 830). For example, one or more of the semiconductor processing tools 102-112 may be used to form a dielectric layer 616 over the layer stack and over a logic portion 202 of the backend region 208, as described herein.

As further shown in FIG. 8, process 800 may include performing a self-aligned etch operation to remove first portions of the dielectric layer from the logic portion and from a top of the layer stack (block 840). For example, one or more of the semiconductor processing tools 102-112 may be used to perform a self-aligned etch operation to remove first portions of the dielectric layer 616 from the logic portion 202 and from a top of the layer stack, as described herein. In some implementations, second portions of the dielectric layer 616, that remain on sidewalls of the layer stack, correspond to sidewall spacers 240 of the RF switch 222.

Process 800 may include additional implementations, such as any single implementation or any combination of implementations described below and/or in connection with one or more other processes described elsewhere herein.

In a first implementation, performing the self-aligned etch operation includes performing a directional etch, using a dry etch technique, without using a patterned masking layer over the layer stack.

In a second implementation, alone or in combination with the first implementation, the dry etch technique includes a plasma-based dry etch technique.

In a third implementation, alone or in combination with one or more of the first and second implementations, an etch direction of the directional etch is approximately perpendicular to a surface of the semiconductor substrate.

In a fourth implementation, alone or in combination with one or more of the first through third implementations, forming the dielectric layer 616 includes forming the dielectric layer 616 to a thickness that is included in a range of approximately 200 angstroms to approximately 500 angstroms.

In a fifth implementation, alone or in combination with one or more of the first through fourth implementations, forming the dielectric layer 616 includes forming the dielectric layer 616 on sidewalls of a PCM layer 234 in the layer stack of the RF switch 222, where the second portions of the dielectric layer 616 remain on the sidewalls of the PCM layer 234 as the sidewall spacers 240.

In a sixth implementation, alone or in combination with one or more of the first through fifth implementations, performing the self-aligned etch operation includes performing the self-aligned etch operation after forming a plurality of electrodes (e.g., an RF in electrode 224, an RF out electrode 226) and a heater element 228 of the RF switch 222.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Figure 9:
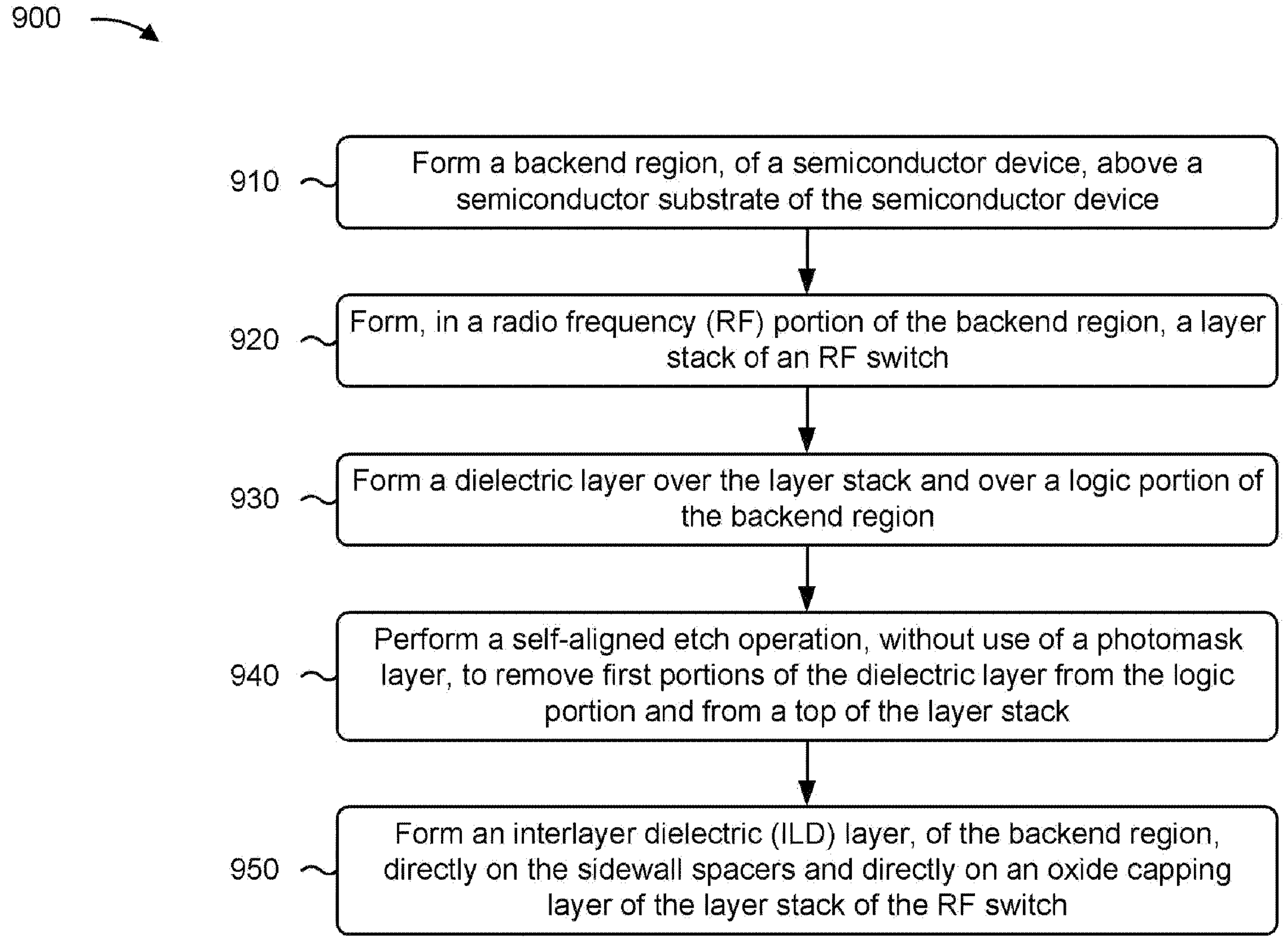
FIG. 9 is a flowchart of an example process associated with forming a semiconductor device described herein.

FIG. 9 is a flowchart of an example process 900 associated with forming a semiconductor device described herein. In some implementations, one or more process blocks of FIG. 9 are performed using one or more semiconductor processing tools (e.g., one or more of the semiconductor processing tools 102-112). Additionally, or alternatively, one or more process blocks of FIG. 9 may be performed using one or more components of device 700, such as processor 720, memory 730, input component 740, output component 750, and/or communication component 760.

As shown in FIG. 9, process 900 may include forming a backend region, of a semiconductor device, above a semiconductor substrate of the semiconductor device (block 910). For example, one or more of the semiconductor processing tools 102-112 may be used to form a backend region 208, of a semiconductor device 200, above a semiconductor substrate (e.g., the substrate 210) of the semiconductor device 200, as described herein.

As further shown in FIG. 9, process 900 may include forming, in an RF portion of the backend region, a layer stack of an RF switch (block 920). For example, one or more of the semiconductor processing tools 102-112 may be used to form, in an RF portion 204 of the backend region 208, a layer stack (e.g., layers 232-238) of an RF switch 222, as described herein.

As further shown in FIG. 9, process 900 may include forming a dielectric layer over the layer stack and over a logic portion of the backend region (block 930). For example, one or more of the semiconductor processing tools 102-112 may be used to form a dielectric layer 616 over the layer stack and over a logic portion 202 of the backend region 208, as described herein.

As further shown in FIG. 9, process 900 may include performing a self-aligned etch operation, without use of a photomask layer, to remove first portions of the dielectric layer from the logic portion and from a top of the layer stack (block 940). For example, one or more of the semiconductor processing tools 102-112 may be used to perform a self-aligned etch operation, without use of a photomask layer, to remove first portions of the dielectric layer 616 from the logic portion 202 and from a top of the layer stack, as described herein. In some implementations, second portions of the dielectric layer 616, that remain on sidewalls of the layer stack, correspond to sidewall spacers 240 of the RF switch 222.

As further shown in FIG. 9, process 900 may include forming an ILD layer, of the backend region, directly on the sidewall spacers and directly on an oxide capping layer of the layer stack of the RF switch (block 950). For example, one or more of the semiconductor processing tools 102-112 may be used to form an ILD layer (e.g., a dielectric layer 216), of the backend region 208, directly on the sidewall spacers 240 and directly on an oxide capping layer 238 of the layer stack of the RF switch 222, as described herein.

Process 900 may include additional implementations, such as any single implementation or any combination of implementations described below and/or in connection with one or more other processes described elsewhere herein.

In a first implementation, process 900 includes forming a conductive layer 602 in the backend region 208, removing portions of the conductive layer 602 from the RF portion 204 of the backend region 208 and from the logic portion 202 of the backend region 208, where remaining portions of the conductive layer 602 correspond to a plurality of electrodes (e.g., an RF in electrode 224, an RF out electrode 226) and a heater element 228 of the RF switch 222, filling in recesses between the plurality of electrodes and the heater element with an oxide layer (e.g., a dielectric fill layer 230), and forming the ILD layer over the RF switch 222, and over a portion of the oxide layer in the logic portion 202 such that the ILD layer is in direct contact with the portion of the oxide layer in the logic portion 202.

In a second implementation, alone or in combination with the first implementation, performing the self-aligned etch operation includes performing the self-aligned etch operation after forming a plurality of electrodes and a heater element 228 of the RF switch 222.

In a third implementation, alone or in combination with one or more of the first and second implementations, performing a self-aligned etch operation includes performing a self-aligned dry etch operation using at least one of a difluoromethane ($CH_2F_2$) gas, an oxygen ($O_2$) gas, an argon (Ar) gas, or a helium (He) gas.

In a fourth implementation, alone or in combination with one or more of the first through third implementations, forming the dielectric layer 616 includes forming the dielectric layer 616 to a thickness that is included in a range of approximately 200 angstroms to approximately 500 angstroms.

In a fifth implementation, alone or in combination with one or more of the first through fourth implementations, forming the layer stack includes forming a PCM layer 234, forming a nitride layer (e.g., a nitride capping layer 236) on the PCM layer 234, and forming an oxide layer (e.g., an oxide capping layer 238) on the nitride layer, and performing the self-aligned etch operation includes performing the self-aligned etch operation to remove the first portions of the dielectric layer 616 from a top of the oxide layer.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

In this way, a semiconductor device includes an RF switch that includes a PCM layer. Sidewall spacers are formed on the sidewalls of the PCM layer to protect the PCM layer from oxidation. The sidewall spacers are formed in a manner that does not increase the thickness of the semiconductor device in other areas of the semiconductor device such as a logic area of the semiconductor device. For example, the sidewall spacers may be formed by depositing a dielectric layer over the RF switch and over the logic area, and performing a directional etch to remove the dielectric layer from the logic area such that the portions of the dielectric layer remain only on the sidewalls of the RF switch as the sidewall spacers. In this way, the sidewall spacers are formed in a manner that enables the PCM layer to be protected from oxidation without increasing the thickness of the semiconductor device in the logic region. This reduces the likelihood of under etching of recesses for interconnects in the logic region, which reduces the likelihood of failure to connect the interconnects with underlying metallization layers in the logic region. Moreover, the directional etch that is performed to form the sidewall spacers is performed without the use of additional masking layers, which reduces the semiconductor processing complexity, time, and cost of manufacturing the RF switch.

As described in greater detail above, some implementations described herein provide a method. The method includes forming a backend region, of a semiconductor device, above a semiconductor substrate of the semiconductor device. The method includes forming, in an RF portion of the backend region, a layer stack of an RF switch. The method includes forming a dielectric layer over the layer stack and over a logic portion of the backend region. The method includes performing a self-aligned etch operation to remove first portions of the dielectric layer from the logic portion and from a top of the layer stack, where second portions of the dielectric layer, that remain on sidewalls of the layer stack, correspond to sidewall spacers of the RF switch.

As described in greater detail above, some implementations described herein provide a semiconductor device. The semiconductor device includes a semiconductor substrate. The semiconductor device includes a backend region above the semiconductor substrate. The semiconductor device includes a PCM RF switch in the backend region. The PCM RF switch includes a plurality of electrodes, a heater element between the plurality of electrodes, a PCM layer above the plurality of electrodes and the heater element, a nitride hard mask layer on the PCM layer, an oxide capping layer on the nitride hard mask layer, and a nitride sidewall spacer on sidewalls of the PCM layer.

As described in greater detail above, some implementations described herein provide a method. The method includes forming a backend region, of a semiconductor device, above a semiconductor substrate of the semiconductor device. The method includes forming, in an RF portion of the backend region, a layer stack of an RF switch. The method includes forming a dielectric layer over the layer stack and over a logic portion of the backend region. The method includes performing a self-aligned etch operation, without use of a photomask layer, to remove first portions of the dielectric layer from the logic portion and from a top of the layer stack, where second portions of the dielectric layer, that remain on sidewalls of the layer stack, correspond to sidewall spacers of the RF switch. The method includes forming an ILD layer, of the backend region, directly on the sidewall spacers and directly on an oxide capping layer of the layer stack of the RF switch.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a backend region, of a semiconductor device, above a semiconductor substrate of the semiconductor device;

forming, in a radio frequency (RF) portion of the backend region, a layer stack of an RF switch;

forming a dielectric layer over the layer stack and over a logic portion of the backend region; and performing a self-aligned etch operation to remove first portions of the dielectric layer from the logic portion and from a top of the layer stack, wherein second portions of the dielectric layer, that remain on sidewalls of the layer stack, correspond to sidewall spacers of the RF switch.

2. The method of claim 1, wherein performing the self-aligned etch operation comprises:

performing a directional etch, using a dry etch technique, without using a patterned masking layer over the layer stack.

3. The method of claim 2, wherein the dry etch technique comprises a plasma-based dry etch technique.

4. The method of claim 2, wherein an etch direction of the directional etch is approximately perpendicular to a surface of the semiconductor substrate.

5. The method of claim 1, wherein forming the dielectric layer comprises:

forming the dielectric layer to a thickness that is included in a range of approximately 200 angstroms to approximately 500 angstroms.

6. The method of claim 1, wherein forming the dielectric layer comprises:

forming the dielectric layer on sidewalls of a phase change material (PCM) layer in the layer stack of the RF switch, wherein the second portions of the dielectric layer remain on the sidewalls of the PCM layer as the sidewall spacers.

7. The method of claim 1, wherein performing the self-aligned etch operation comprises:

performing the self-aligned etch operation after forming a plurality of electrodes and a heater element of the RF switch.

8. A method, comprising:

forming a backend region, of a semiconductor device, above a semiconductor substrate of the semiconductor device;

forming, in a radio frequency (RF) portion of the backend region, a layer stack of an RF switch;

forming a dielectric layer over the layer stack and over a logic portion of the backend region;

performing a self-aligned etch operation, without use of a photomask layer, to remove first portions of the dielectric layer from the logic portion and from a top of the layer stack, wherein second portions of the dielectric layer, that remain on sidewalls of the layer stack, correspond to sidewall spacers of the RF switch; and forming an interlayer dielectric (ILD) layer, of the backend region, directly on the sidewall spacers and directly on an oxide capping layer of the layer stack of the RF switch.

9. The method of claim 8, further comprising:

forming a conductive layer in the backend region;

removing portions of the conductive layer from the RF portion of the backend region and from the logic portion of the backend region, wherein remaining portions of the conductive layer correspond to a plurality of electrodes and a heater element of the RF switch;

filling in recesses between the plurality of electrodes and the heater element with an oxide layer; and forming an interlayer dielectric (ILD) layer over the RF switch, and over a portion of the oxide layer in the logic portion such that the ILD layer is in direct contact with the portion of the oxide layer in the logic portion.

10. The method of claim 8, wherein performing the self-aligned etch operation comprises:

performing the self-aligned etch operation after forming a plurality of electrodes and a heater element of the RF switch.

11. The method of claim 8, wherein performing a self-aligned etch operation comprises:

performing a self-aligned dry etch operation using at least one of:

a difluoromethane ($CH_2F_2$) gas, an oxygen ($O_2$) gas, an argon (Ar) gas, or a helium (He) gas.

12. The method of claim 8, wherein forming the dielectric layer comprises:

forming the dielectric layer to a thickness that is included in a range of approximately 200 angstroms to approximately 500 angstroms.

13. The method of claim 8, wherein forming the layer stack comprises:

forming a phase change material (PCM) layer;

forming a nitride layer on the PCM layer; and forming an oxide layer on the nitride layer; and wherein performing the self-aligned etch operation comprises:

performing the self-aligned etch operation to remove the first portions of the dielectric layer from a top of the oxide layer.

14. A method, comprising:

forming a semiconductor substrate;

forming a backend region above the semiconductor substrate; and forming a phase change material (PCM) radio frequency (RF) switch in the backend region, wherein the PCM RF switch comprises:

a plurality of electrodes;

a heater element between the plurality of electrodes;

a PCM layer above the plurality of electrodes and the heater element;

a nitride hard mask layer on the PCM layer;

an oxide capping layer on the nitride hard mask layer; and a nitride sidewall spacer on sidewalls of the PCM layer.

15. The method of claim 14, wherein the nitride sidewall spacer fully extends around a perimeter of the PCM layer in a top-down view of the RF switch.

16. The method of claim 14, wherein a first bottom surface, of a first portion of the nitride sidewall spacer on a first side of the PCM layer, is located on an RF electrode of the RF switch; and wherein a second bottom surface, of a second portion of the nitride sidewall spacer on a second side of the PCM layer, is located on a thermal dielectric layer between the PCM layer and the heater element.

17. The method of claim 16, wherein the first side and the second side are adjacent sides of the PCM layer.

18. The method of claim 14, wherein the oxide capping layer is in direct contact with an oxide dielectric layer of the backend region.

19. The method of claim 14, wherein the nitride sidewall spacer comprises a curved outer surface.

20. The method of claim 14, wherein the nitride sidewall spacer is located above the plurality of electrodes of the PCM RF switch.

* * * * *